United States Patent
Okita et al.

(10) Patent No.: US 6,538,721 B2
(45) Date of Patent: Mar. 25, 2003

(54) SCANNING EXPOSURE APPARATUS

(75) Inventors: Shinichi Okita, Kumagaya (JP);
Tsuneyuki Hagiwara, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/085,211

(22) Filed: Feb. 27, 2002

(65) Prior Publication Data

US 2002/0149755 A1 Oct. 17, 2002

Related U.S. Application Data

(63) Continuation-in-part of application No. 09/817,316, filed on Mar. 26, 2001, now abandoned.

(30) Foreign Application Priority Data

Mar. 24, 2000 (JP) .......................................... 2000-085282

(51) Int. Cl.[7] .............................................. G03B 27/42
(52) U.S. Cl. ............................ 355/53; 355/77; 356/401; 250/548
(58) Field of Search ............................ 355/43, 45, 53, 355/77; 250/548; 356/399–401

(56) References Cited

U.S. PATENT DOCUMENTS

| | | | | |
|---|---|---|---|---|
| 5,448,332 A | * | 9/1995 | Sakakibara et al. | 355/53 |
| 5,657,130 A | * | 8/1997 | Shirasu et al. | 250/548 |
| 5,936,711 A | * | 8/1999 | Miyai et al. | 250/548 |
| 5,998,801 A | * | 12/1999 | Imai | 250/548 |
| 6,094,256 A | | 7/2000 | Grodnensky et al. | 355/77 |
| 6,172,373 B1 | * | 1/2001 | Hara et al. | 250/548 |
| 6,225,012 B1 | * | 5/2001 | Nishi et al. | 430/22 |
| 6,236,447 B1 | * | 5/2001 | Yamada et al. | 355/53 |
| 6,333,510 B1 | * | 12/2001 | Watanabe et al. | 250/559.27 |
| 6,449,029 B1 | * | 9/2002 | Fujimoto | 250/548 |

FOREIGN PATENT DOCUMENTS

JP 06-283403 10/1994 ......... H01L/21/027

OTHER PUBLICATIONS

"Optical Microlithography XIV" Christopher J. Progler Feb. 27–Mar. 2, 2001 vol. 4346, Part 1, pp. 408 to 419.

* cited by examiner

Primary Examiner—D Rutledge
(74) Attorney, Agent, or Firm—Synnestvedt & Lechner LLP

(57) ABSTRACT

A scanning exposure apparatus which promptly analyzes a cause for a variation in exposure line width. The scanning exposure apparatus includes a mask stage on which a mask is placed, a wafer stage on which a wafer is placed, a focusing mechanism which detects surface position information of the wafer and adjustment means which adjusts the surface position of the wafer. Control means acquires pose information of the wafer adjusted by the adjustment means at the time of exposure and stores the pose information in a memory in association with preacquired surface shape information of an exposure area. A state in which the exposed surface of the wafer has been exposed with respect to exposure light is known from the pose information and the surface shape information.

27 Claims, 23 Drawing Sheets

Flatness data

Trace data (Variation of Point Po with Respect to Image Forming Surface)

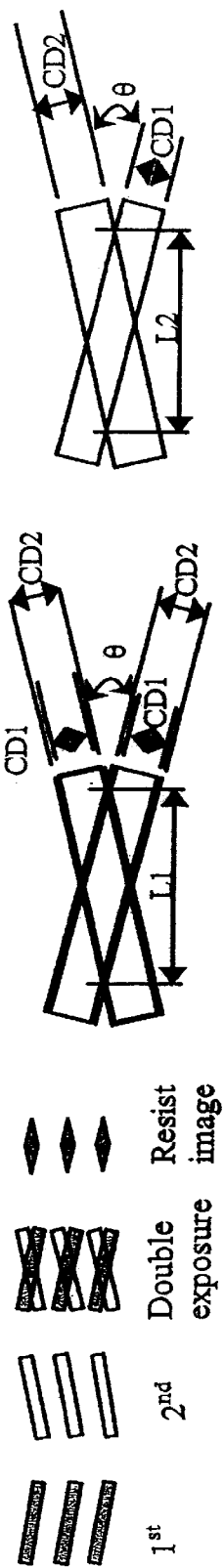

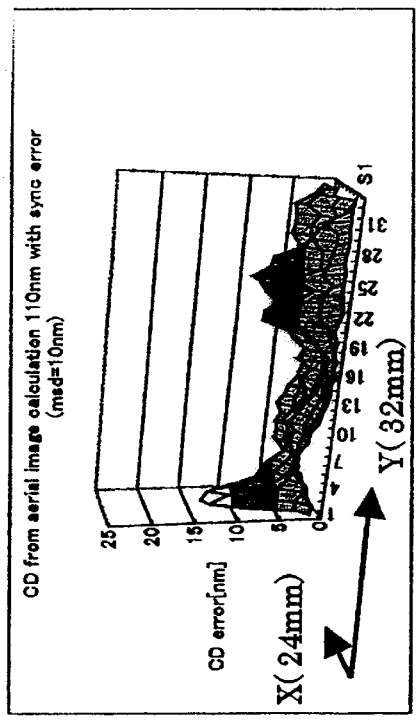
Fig.20(a) CD variation map: 3sigma=6.8nm, p-p=13.1nm
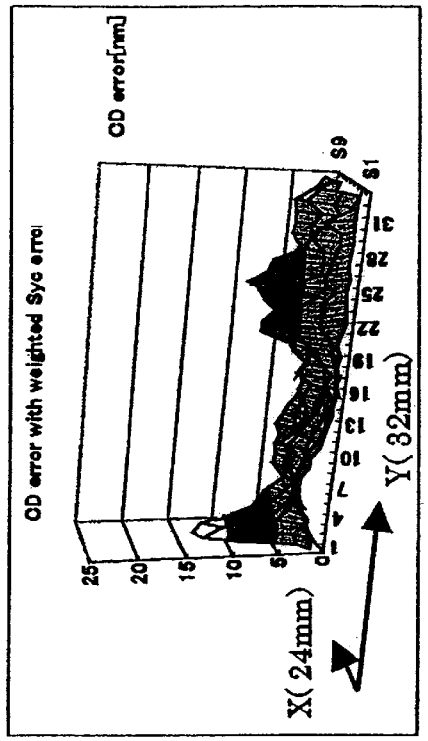
Fig.20(b) CD variation map: 3sigma=6.8nm, p-p=13.1nm
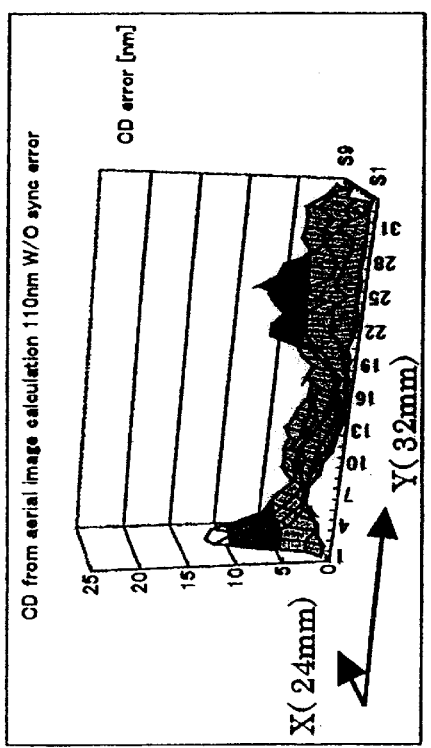
Fig.20(d) CD variation map: 3sigma=6.5nm, p-p=12.1nm.
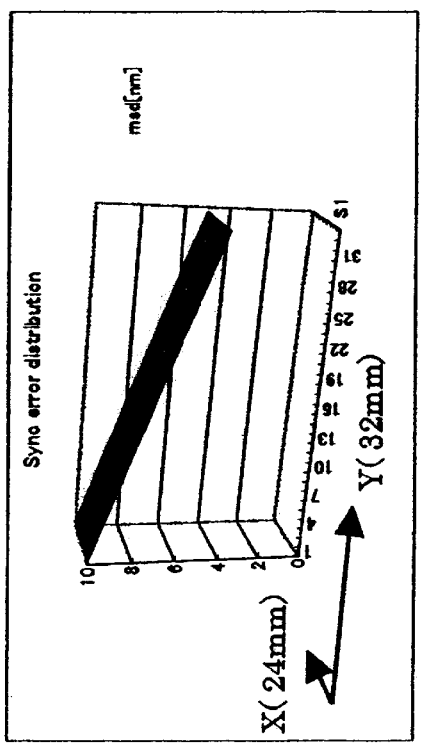
Fig.20(c) sync-error distribution.

SCANNING EXPOSURE APPARATUS

CROSS-REFERENCE TO RELATED APPLICATIONS

This application is a continuation-in-part application of pending U.S. patent application Ser. No. 09/817,316 filed on Mar. 26, 2001, now abandoned entitled "Scanning Exposure Apparatus".

BACKGROUND OF THE INVENTION

The present invention relates to a scanning exposure apparatus, and, more particularly, to a scanning exposure apparatus which is used in the lithography process for fabricating micro devices, such as a semiconductor device, liquid crystal display device, image pickup device (CCD or the like) and thin-film magnetic head.

One known scanning exposure apparatus of this type comprises a mask stage on which a photomask or reticle (hereinafter called "mask") having a circuit pattern formed thereon is to be placed, a substrate stage on which a substrate (wafer, glass plate or the like) coated with a photosensitive material is to be placed, a focusing mechanism which detects surface position information of the substrate and adjustment means which adjusts the surface position of the substrate based on the result of detection by the focusing mechanism. This scanning exposure apparatus moves individual shot areas of a wafer into the exposure field of a projection optical system one after another and sequentially exposes the pattern image of a mask on the individual shot areas.

For example Japanese Unexamined Patent Publication No. 06-283403 discloses a known surface position setting apparatus (focusing mechanism) for use in such a scanning exposure apparatus. The surface position setting apparatus is provided with multi-point measuring means that measures the height of a substrate parallel to the optical axis of the projection optical system at a plurality of measuring points of the substrate in the scanning direction and a direction intersecting the scanning direction. At the time of scanning the substrate, the surface position setting apparatus measures the height at each measuring point with respect to an exposure field which is conjugate with an illumination area of a predetermined shape with respect to the projection optical system when the substrate is scanned. Based on the maximum and minimum values of the results of measuring the individual measuring points, the surface position setting apparatus acquires the average surface of the exposure surface and then acquires a difference between the height of the average surface and the height of the image surface of the projection optical system. Next, the surface position setting apparatus sets the height of the substrate with the substrate stage based on the difference and aligns the exposure surface.

When the exposure line widths of patterns formed on the individual shot areas of the substrate vary, the conventional scanning exposure apparatus cannot quickly find out the cause or reason for the occurrence of the variation and requires a considerable time and a significant amount of labor to analyze and check the cause.

SUMMARY OF THE INVENTION

Accordingly, it is an object of the present invention to provide a scanning exposure apparatus which quickly analyzes a cause of a variation in exposure line width.

According to the first aspect of the present invention, there is provided a scanning exposure apparatus for projecting an image of a pattern of a mask on a substrate using exposure light and relatively scanning the substrate with the exposure light, thereby exposing an exposure area on the substrate. The scanning exposure apparatus includes surface position detection means for detecting surface position information of the substrate, and adjustment means for adjusting a surface position of the substrate based on the result of detection by the surface position detection means. The scanning exposure apparatus further includes control means for acquiring pose information of the substrate adjusted by the adjustment means at the time of exposure based on a detection signal from the surface position detection means and storing the pose information in a memory in association with preacquired surface shape information of the exposure area on the substrate.

According to the second aspect of the present invention, there is provided a scanning exposure method of projecting an image of a mask pattern on a substrate using exposure light and relatively scanning the substrate with the exposure light, thereby exposing an exposure area on the substrate. The scanning exposure method includes the step of detecting pose information of the substrate by detecting a surface position of the substrate at the time of exposure, and the step of predicting a state of the image of the pattern to be formed on the substrate based on the detected pose information and preacquired surface shape information in an exposure area of the substrate.

According to the third aspect of the present invention, there is provided a management apparatus which manages exposure process information of a scanning exposure apparatus. The exposure apparatus includes surface position detection means for detecting surface position information of a substrate and adjustment means for adjusting a surface position of the substrate based on the result of detection by the surface position detection means. The scanning exposure apparatus projects an image of a pattern of a mask on the substrate using exposure light and scans relatively the substrate with the exposure light, thereby exposing an exposure area on the substrate. The management apparatus includes an interface connected to the scanning exposure apparatus, and control means for acquiring pose information of the substrate adjusted by the adjustment means at a time of exposure based on a detection signal from the surface position detection means acquired via the interface, and storing the pose information in a memory in association with preacquired surface shape information of the exposure area on the substrate.

According to the fourth aspect of the invention, there is provided a management method which manages exposure process information of a scanning exposure apparatus. The scanning exposure apparatus includes surface position detection means for detecting surface position information of a substrate and adjustment means for adjusting a surface position of the substrate based on the result of detection by the surface position detection means. The scanning exposure apparatus projects an image of a pattern of a mask on the substrate using exposure light and scans relatively the substrate with the exposure light, thereby exposing an exposure area on the substrate. The management method includes the step of acquiring a detection signal from the surface position detection means via an interface from the scanning exposure apparatus, the step of acquiring pose information of the substrate adjusted by the adjustment means at the time of exposure, and the step of predicting a state of the image of the pattern to be formed on the substrate based on the pose information and preacquired surface shape information of the exposure area on the substrate.

BRIEF DESCRIPTION OF THE DRAWINGS

The features of the present invention that are believed to be novel are set forth with particularity in the appended claims. The invention, together with objects and advantages thereof, may best be understood by reference to the following description of the presently preferred embodiments together with the accompanying drawings.

FIGS. 19(A)–19(C) are diagrams showing wedge mark CD magnification technique using double exposure;

FIGS. 20(A), 20(B) and 20(D) are graphs showing X-Y sync errors introduced to a calculation of the CD variation;

FIG. 20(C) is a graph showing sync-error distribution;

DETAILED DESCRIPTION OF THE PREFERRED EMBODIMENTS

A first embodiment of a scanning exposure apparatus according to the present invention will be described below referring to FIGS. 1 through 19.

Figure 1:
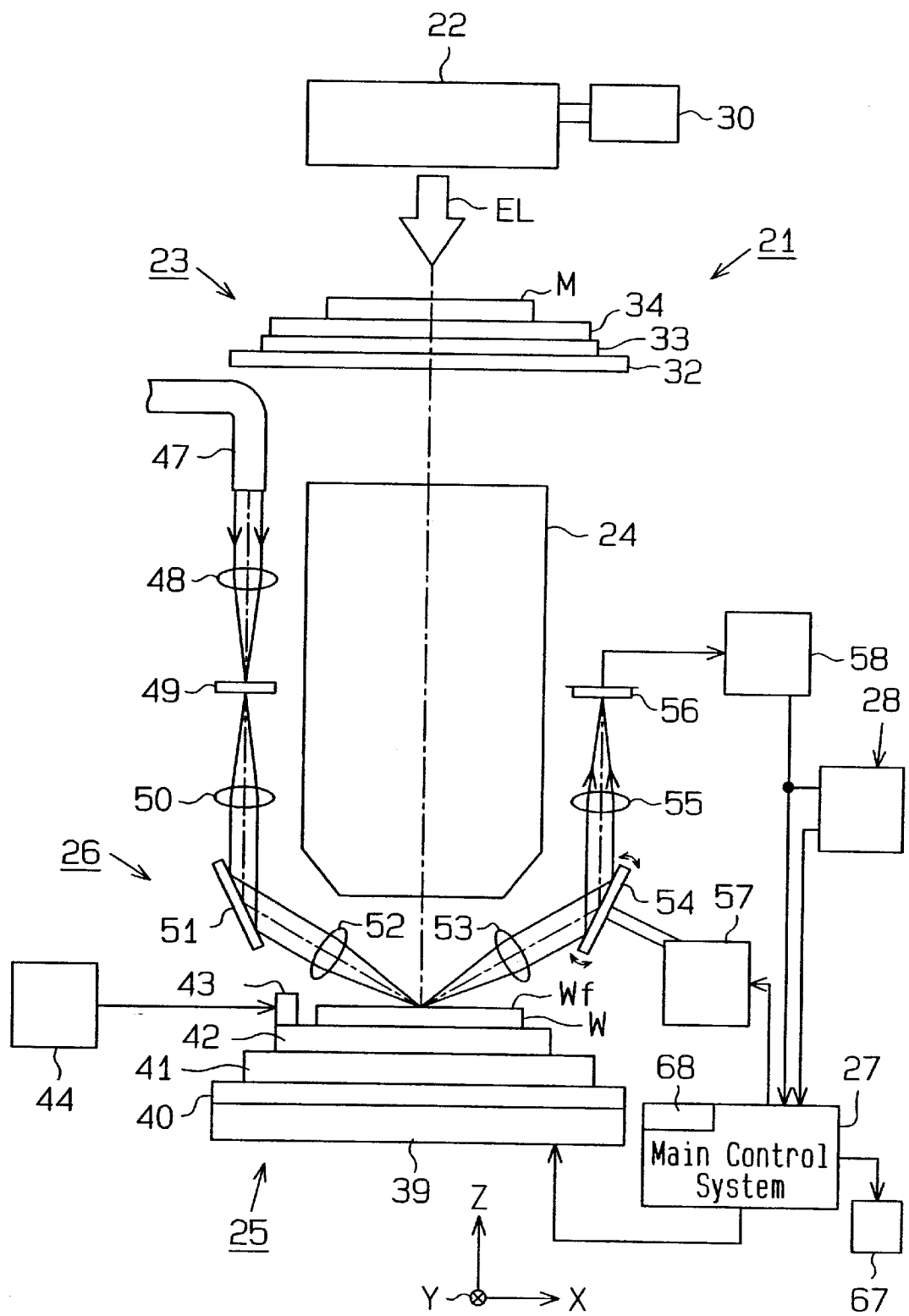
FIG. 1 is a structural diagram of a scanning exposure apparatus according to the first embodiment of the present invention, mainly illustrating a focusing mechanism thereof.
Figure 3:
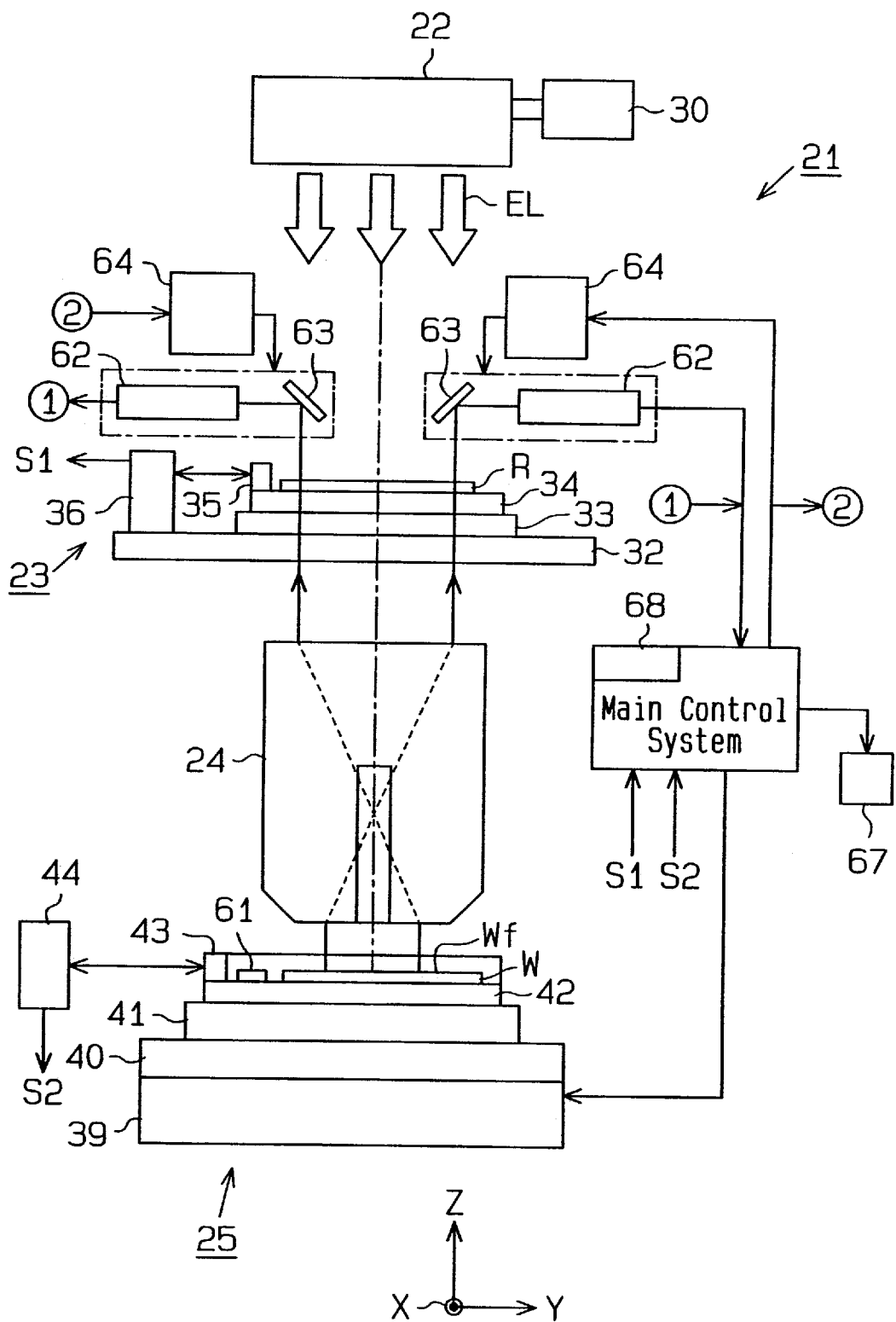
FIG. 3 is a structural diagram of the scanning exposure apparatus of FIG. 1, mainly illustrating a mask stage and substrate stage thereof.

As shown in FIGS. 1 and 3, a scanning exposure apparatus 21 includes an illumination optical system 22, a mask stage 23 on which a mask M having a predetermined pattern formed thereon is placed, a projection optical system 24 and a wafer stage 25 as a substrate stage on which a wafer W as a photosensitive substrate is placed. The scanning exposure apparatus 21 further includes a focusing mechanism 26 of an off-axis type that constitutes a part of surface position detection means which detects surface position information of the wafer W, and a main control system 27 that constitutes a part of adjustment means which adjusts the surface position of the wafer W based on the result of detection by the focusing mechanism 26.

The scanning exposure apparatus 21 projects the pattern of the mask M on the wafer W using exposure light EL and sequentially exposes exposure areas (a plurality of shot areas SAij shown in FIG. 4) on the wafer W by relatively scanning the wafer W with the exposure light EL. The scanning exposure apparatus 21 also includes a ΔCD management apparatus 28 (see FIGS. 1 and 6) as control means which measures the actual state where the exposure areas on the wafer W have been exposed and performs analysis, such as prediction of a variation amount ΔCD of the exposure line width, from the measuring result.

The exposure light EL from a light source 30, such as a high-pressure mercury lamp, a KrF excimer laser, an ArF excimer laser, an $F_2$ excimer laser, a metal vapor laser or a YAG laser which generates harmonic waves, enters the illumination optical system 22. The illumination optical system 22 includes various lens systems, such as a relay lens, fly-eye lens (or rod integrator) and condenser lens, an aperture stop and a blind located at a position conjugate to the pattern surface of the mask M. When the exposure light EL passes the illumination optical system 22, it is so adjusted as to evenly illuminate a circuit pattern on the mask M. The illumination area of the exposure light EL is formed like slits as indicated by solid lines in FIG. 2A.

Figure 4:
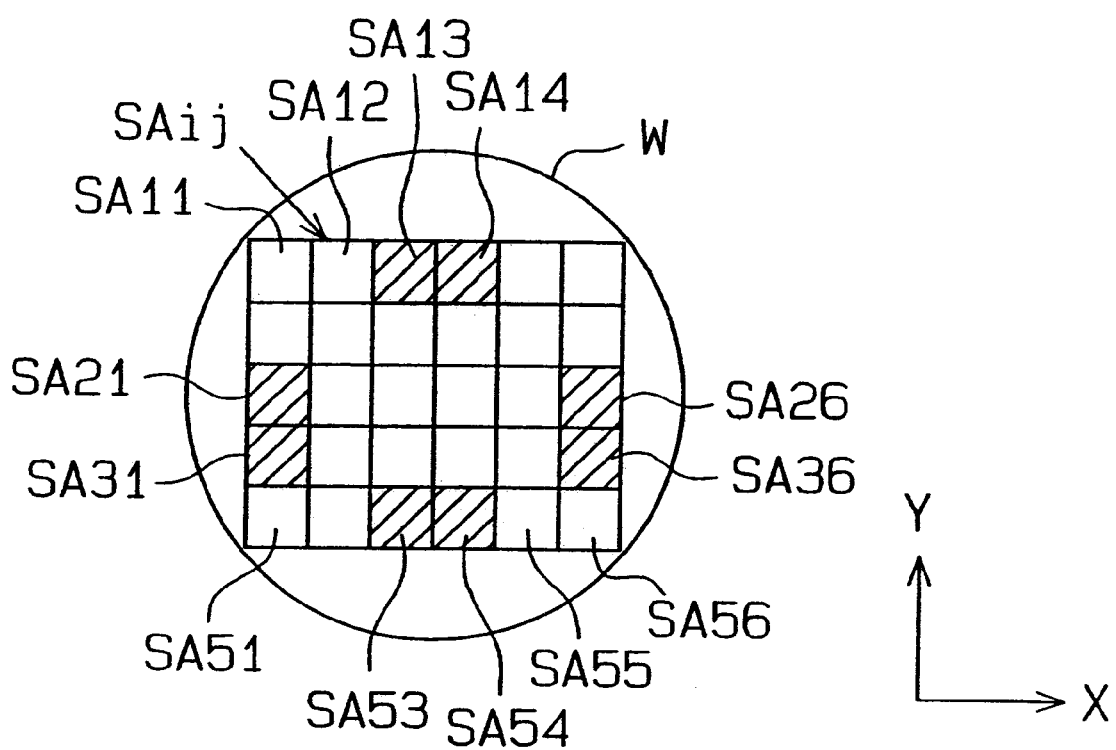
FIG. 4 is a plan view showing a plurality of shot areas on a wafer.
Figure 5:
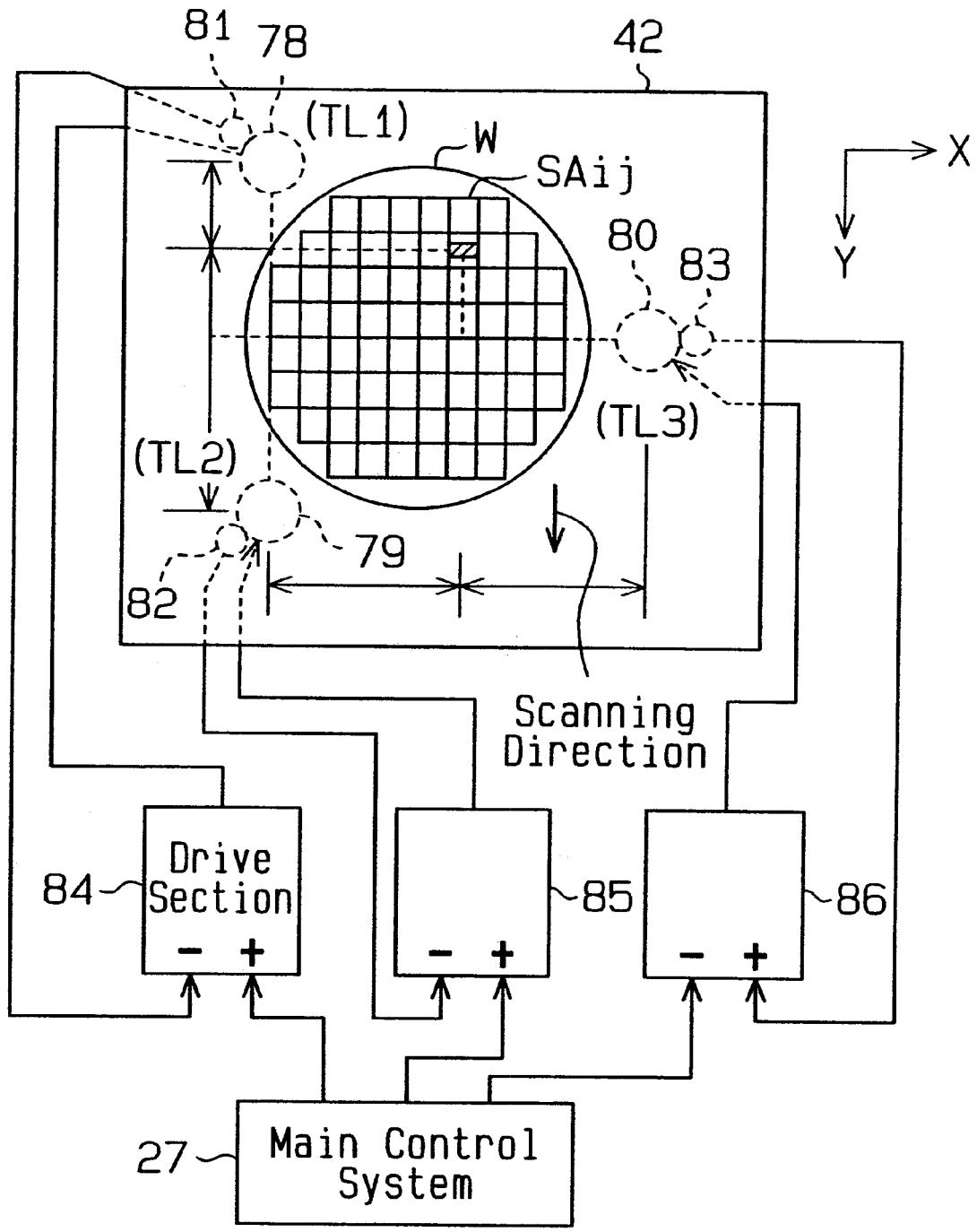
FIG. 5 is a structural diagram illustrating an auto-focus and auto-leveling mechanisms in the scanning exposure apparatus of FIG. 1 and a control structure therefor.

As the mask M and wafer W are scanned synchronously with respect to the slit exposure field 76, the circuit pattern on the mask M is sequentially exposed on the shot areas SA on the exposure surface Wf of the wafer W shown in FIG. 4. For example, the wafer W is scanned in the Y direction to the exposure field 76 in the shot area SA11, and is scanned in the −Y direction to the exposure field 76 in the next shot area SA12. This scanning is repeated thereafter to expose the remaining individual shot areas one after another, starting with the shot area SA13.

The mask stage 23 is located under the illumination optical system 22 such that its mask mounting surface intersects the optical-axial direction of the projection optical system 24 at right angles. The mask stage 23 has a Y-directional-mask-drive stage 33 which can be driven on a mask support 32 in the Y direction (perpendicular to the surface of the sheet of FIG. 1). A slight-mask-drive stage 34 which forms the mask mounting surface is placed on the Y-directional-mask-drive stage 33. The mask M is held on the slight-mask-drive stage 34 by vacuum chuck or the like.

The slight-mask-drive stage 34 controls the position of the mask M slightly and precisely in the X direction parallel to the surface of the sheet of FIG. 1, the Y direction perpendicular to the surface of the sheet of FIG. 1 and the rotational direction (the direction of θ) around the axis parallel to the optical axis of the projection optical system 24, within the plane perpendicular to the optical axis of the projection optical system 24. A movable mirror 35 (see FIG. 3) is placed on the slight-mask-drive stage 34, and an interferometer 36 on the mask support 32 The interferometer 36 always monitors the positions of the slight-mask-drive stage 34 in the X direction, the Y direction and the θ direction. Positional information S1 acquired by the interferometer 36 is supplied to the main control system 27.

The projection optical system 24 includes a plurality of lenses which are unillustrated. When the exposure light EL passes the projection optical system 24, its cross-sectional shape is reduced to a predetermined reduction ratio of 1/n (n: a positive integer) from the size of the illumination area. The circuit pattern on the mask M is projected and transferred in the predetermined reduction ratio on the exposure surface Wf of the wafer W held on the wafer stage 25 so as to intersect the optical axis of the projection optical system 24.

The wafer stage 25 is located under the projection optical system 24 such that its wafer mounting surface intersects the optical-axial direction of the projection optical system 24. A Y-directional-wafer-drive stage 40 which can be driven in the Y direction is placed on a wafer support 39 of the wafer stage 25. An X-directional-wafer-drive stage 41 which can be driven in the X direction is placed on the Y-directional-wafer-drive stage 40. Provided on the X-directional-wafer-drive stage 41 is a Z-leveling stage 42 whose top surface can be tilted slightly to the XY plane perpendicular to the optical axis of the projection optical system 24 and which can be driven slightly in the Z direction parallel to that optical axis. The wafer W is held on the Z-leveling stage 42 by vacuum chuck. A movable mirror 43 having an L-shaped plane extending in the X direction and Y direction is fixed on the Z-leveling stage 42. A pair of interferometers 44 are so arranged as to face the outer faces of the movable mirror 43. One interferometer 44 shown in FIG. 1 monitors the X-directional position of the Z-leveling stage 42, and the other interferometer 44 shown in FIG. 3 monitors the Y-directional position of the stage 42. Both interferometers 44 monitor the position of the stage 42 in the θ direction. Positional information S2 acquired by those interferometers 44 is supplied to the main control system 27.

At the time of exposure, the mask M is scanned in the Y direction to the slit exposure field 76, i.e., in the direction toward or away from the surface of the sheet of FIG. 1, at a constant velocity V. In synchronism with the movement of the mask M, the wafer W is scanned in the direction away from or toward the surface of the sheet of FIG. 1, at a constant velocity V/β (1/β is the reduction ratio of the projection optical system 24). The synchronous scanning of the mask M and the wafer W is carried out under the control of the main control system 27.

Figure 2A:
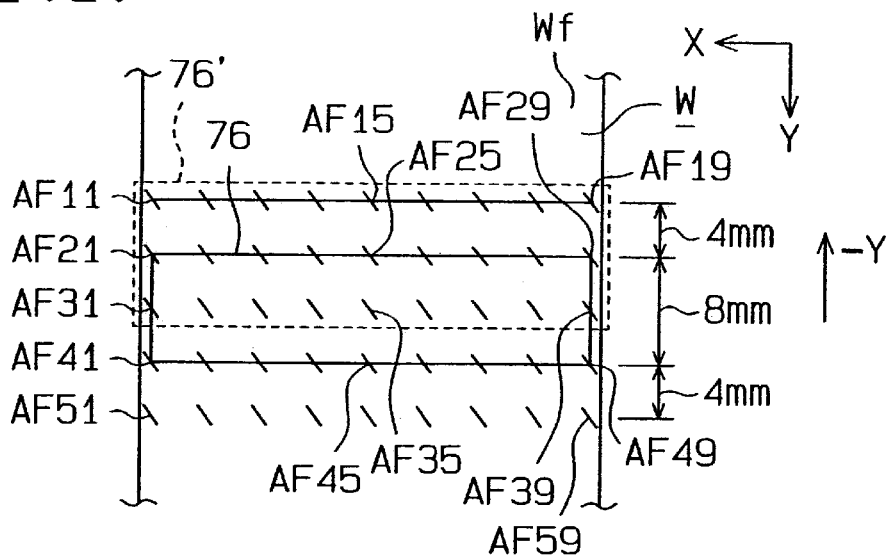
FIG. 2A is an explanatory diagram showing the relationship between multiple measuring points on an exposure surface and an exposure field.
Figure 2B:
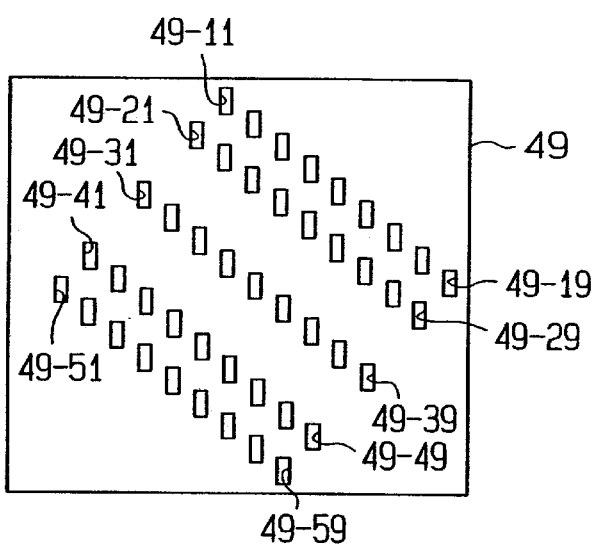
FIG. 2B is an explanatory diagram showing the layout of opening patterns on a pattern forming plate.
Figure 2C:
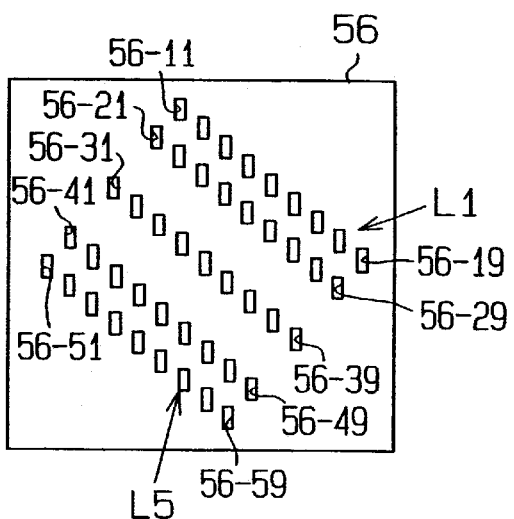
FIG. 2C is an explanatory diagram showing the layout of photosensor on a photo-detector.

As shown in FIGS. 1 and 2, illumination light, different from the exposure light EL, which does not expose a photoresist on the wafer W is led to the focusing mechanism 26 from an unillustrated illumination light source via a bundle of optical fibers (hereinafter called "optical bundle fiber") 47. The illumination light emitted from the optical fiber bundle 47 passes through a condenser lens 48 and illuminates a pattern forming plate 49 having multiple slit openings 49-ij (i=1 to 5, j=1 to 9; see FIG. 2B). As shown in FIG. 2B, nine slit openings 49-11 to 49-19 are formed in the first row on the pattern forming plate 49, and nine slit openings are likewise formed in each of the second to fifth rows. That is, a total of 45 slit openings are formed in the pattern forming plate 49.

The illumination light that has passed the pattern forming plate 49 is projected on the exposure surface Wf of the wafer W via a lens 50, a mirror 51 and an illumination objective lens 52. A pattern image which is comprised of the slit openings 49-11 to 49-59 of the pattern forming plate 49 is projected on the exposure surface Wf obliquely to the X axis and Y axis, shown in FIG. 2A.

The images of the slit openings 49-ij are projected on the exposure surface Wf in association with a first row of nine measuring points AF11 to AF19 aligned in the X direction above the slit exposure field 76, second to fourth rows of measuring points AF21 to AF49 aligned in the X direction within the exposure field 76 and a fifth row of measuring points AF51 to AF59 aligned in the X direction below the slit exposure field 76 in FIG. 2A. In this embodiment, the first row of measuring points AF11–AF19 are located at a position apart upward by a predetermined distance (e.g., 4 mm) from one of the long sides of the rectangular exposure field 76, and the second row of measuring points AF51–AF59 are located at a position apart downward by a predetermined distance from the other long side of the exposure field 76.

The illumination light that has been reflected at the exposure surface Wf of the wafer W is projected again on the light-receiving surface of a photo-detector 56 via a condenser objective lens 53, a rotational-direction vibration plate 54 and an image forming lens 55. In other words, a pattern image comprised of the slit openings 49-ij on the pattern forming plate 49 is formed again on that light-receiving surface. Multiple photosensors 56-ij (i=1 to 5, j=1 to 9; see FIG. 2C) are laid out on the light-receiving surface of the photo-detector 56. That is, nine photosensors 56-11 to 56-19 are arranged in the first row on the photo-detector 56 and photosensors 56-21 to 56-59 are likewise arranged on the photo-detector 56, nine in each of the second to fifth rows. A total of 45 photosensors 56-ij (i=1 to 5, j=1 to 9) are laid out on the photo-detector 56 and unillustrated slit apertures are arranged on the respective photosensors. 56-ij. The images of the slit openings 49-ij projected on the respective measuring points AFij (i=1 to 5, j=1 to 9) in FIG. 2A are formed again on the associated photosensors 56-ij.

At the time the images of the slit openings 49-ij that have been reflected at the exposure surface Wf are formed again on the photo-detector 56, the rotational-direction vibration plate 54 shown in FIG. 1 is rotationally vibrated so as to vibrate the positions of the individual images in the direction of the short sides of the openings of the unillustrated slit apertures. Detection signals detected by the photosensors 56-ij are supplied to a signal processor 58. The signal processor 58 synchronously detects the individual detection signals with a signal of a rotational vibration frequency, thereby generating nine focus signals corresponding to focus positions in the Z direction parallel to the optical axis of the projection optical system 24 at arbitrary plural points (nine points in the embodiment) in the measuring points AFij on the wafer W.

The signal processor 58 normally outputs the nine generated focus signals. The main control system 27 computes the control target position of the wafer W in the Z direction using an unillustrated internal computing section based on the nine focus signals output from the signal processor 58. The target position includes control target values for the inclination angles of the exposure surface Wf of the wafer W (the roll or the inclination θx in the X direction and the pitch or inclination θy in the Y direction) and a control target value for an average focus position (the position of the aligning plane). The main control system 27 drives the Z-leveling stage 42 via drive sections 84 to 86 and fulcrums 78 to 80 shown in FIG. 5 based on control signals corresponding to the control target values for the computed inclination angles and position of the aligning plane. This driving ensures the adjustment of the inclination (roll and pitch) of the exposure surface Wf of the wafer W and the height thereof in the Z direction so that the exposure surface Wf is aligned with the aligning plane.

Specifically, when the wafer W is scanned in the Y direction in FIG. 2 with respect to the exposure field 76, the main control system 27 pre-reads an area located immediately in front of the exposure field 76 on the exposure surface Wf by means of three sensors 56-11, 56-15 and 56-19 (corresponding to the measuring points AF11, AF15 and AF19) in the first row of nine photosensors 56-11 to 56-19 and six sensors 56-21, 56-25, 56-29, 56-31, 56-35 and 56-39 (corresponding to the measuring points AF21, AF25, AF29, AF31, AF35 and AF39) in the exposure field 76. That is, the Z-directional positions at the nine measuring points AF11, AF15, AF19, AF21, AF25, AF29, AF31, AF35 and AF39 lying in an area 76' located before the exposure field 76 by 4 mm in the scanning direction are pre-read, Likewise, when the wafer W is scanned in the −Y direction in FIG. 2 with respect to the exposure field 76, an area located immediately in front of the exposure field 76 on the exposure surface Wf is pre-read by nine sensors 56-51, 56-55, 56-59, 56-41, 56-45, 56-49, 56-31, 56-35 and 56-39. For example, the Z-directional positions at the nine measuring points AF51, AF55, AF59, AF41, AF45, AF49, AF31, AF35 and AF39 lying in an area located before the exposure field 76 by 4 mm in the scanning direction are pre-read. In this sense, the photosensors 56-11, 56-15, 56-19, 56-21, 56-25, 56-29, 56-31, 56-35 and 56-39 are called a Y-directional pre-read sensor L1 and the photosensors 56-51, 56-55, 56-59, 56-41, 56-45, 56-49, 56-31, 56-35 and 56-39 are called a −Y-directional pre-read sensor L5. The pre-reading is accomplished by sampling nine focus signals, which are normally output from the signal processor 58 in association with the nine detection signals from the pre-read sensor L1 or L5, multiple times at a predetermined timing in the scanning direction by means of the main control system 27 at the time the individual shot areas are scanned with respect to the exposure field 76.

Further, the aligning position and the X- and Y-directions inclination angles of the exposure surface Wf of the wafer W on the Z-leveling stage 42 are set to desired values by adjusting the stretching/contraction amounts of the fulcrums 78–80 by means of the drive sections 84–86 (see FIG. 5) under the control of the main control system 27.

As apparent from the above, the main control system 27 calculates the control target position of the pre-read area of the exposure surface Wf at the time of exposure based on the nine focus signals output from the signal processor 58 when the pre-read sensor L1 or L5 performs pre-reading. The control target position includes the average focus position of the exposure surface Wf (tho position of the aligning plane) that coincides with the Z-directional position of the image surface of the projection optical system 24 and the inclination angles θx and θy of the exposure surface Wf at which the image surface and the exposure surface Wf become parallel to each other. At time t1 which is a predetermined time (the time needed for the wafer W to move 4 mm in this scanning direction in this embodiment) passed from t0 at which an arbitrary point on the exposure surface Wf is pre-read, the main control system 27 considers that the pre-read area has reached the exposure position (the lower position of the exposure field 76) and controls the Z-leveling stage 42 so as to align the exposure surface Wf with the image surface of the projection optical system 24.

As shown in FIG. 3, a reference marker plate 61 is secured in the vicinity of the wafer W on the Z-leveling stage 42 and various reference markers are formed on the substrate marker plate 61. Provided above the mask M are a pair of mask alignment microscopes 62 for simultaneously observing the reference markers on the reference marker plate 61 and a marker on the mask M. A pair of deflection mirrors 63 are disposed movable between the mask stage 23 and the mask alignment microscopes 62 to guide the detected light from the mask M to the mask alignment microscopes 62. When the exposure sequence is initiated, the deflection mirrors 63 are moved away sideward from the positions above the mask M by a mirror driving unit 64 in response to an instruction from the main control system 27. This can associate the wafer coordinate system defined by the coordinates that are measured by the pair of interferometers 44 on the wafer side with the mask coordinate system defined by the coordinates that are measured by the interferometer 36 on the mask side, or can align the wafer W with the mask M.

As apparent from the above, the main control system 27 controls the general operation of the scanning exposure apparatus 21, including the operation of positioning the stages 40–42 of the wafer stage 25 and the stages 33 and 34 of the mask stage 23, the synchronous exposure of the mask M and the wafer W and the focusing operation of the focusing mechanism 26.

Figure 6:
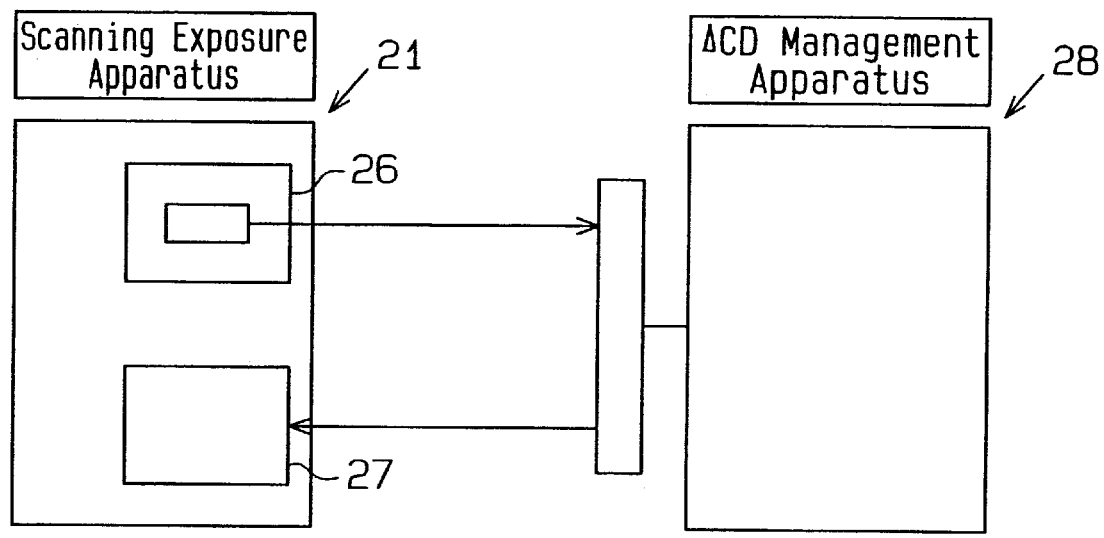
FIG. 6 is a schematic diagram depicting a ΔCD management apparatus connected to the scanning exposure apparatus.
Figure 7:
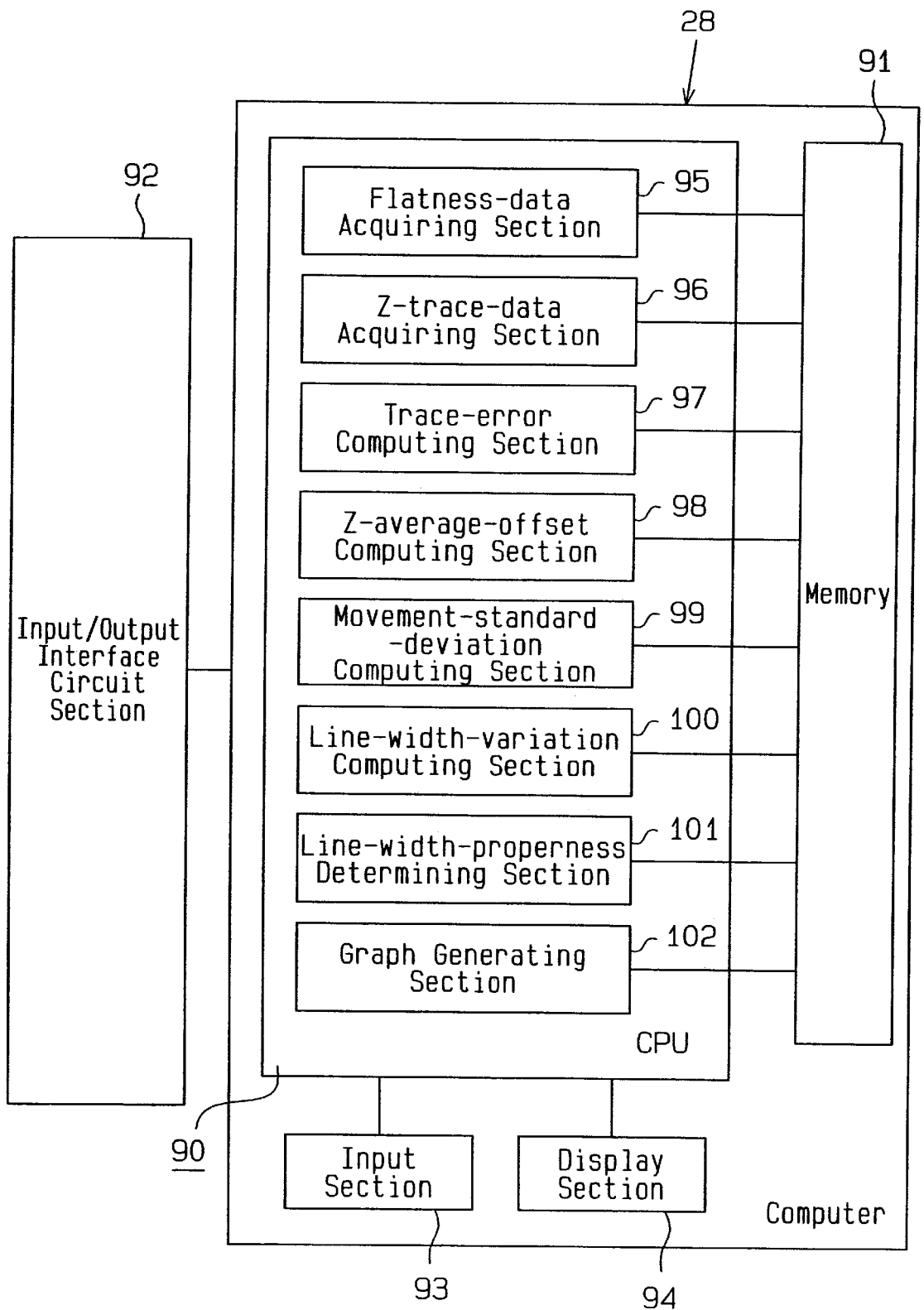
FIG. 7 is a block diagram showing the ΔCD management apparatus.

The ΔCD management apparatus 28 will now be discussed with reference to FIGS. 6 and 7. The ΔCD management apparatus 28 measures in what focus state individual points only in each of measuring shot areas automatically or manually selected from a plurality of shot areas SAij shown in FIG. 4 (eight areas SA13, SA14, . . . , SA53 and SA54 hatched in FIG. 4) have actually been exposed. For example, each selected measuring shot area is considered as segments having the slit widths of the exposure field 76 and aligned in the scanning direction and the ΔCD management apparatus 28 sequentially measures in what focus state a series of segment surface portions consecutive at the slit widths in the scanning direction have actually been exposed. Based on the measuring result, the ΔCD management apparatus 28 analyzes the cause of the variation amount ΔCD of the exposure line width of a pattern actually exposed at each position in each of the measuring shot areas SA13, SA14 and so forth, specifically, whether the variation has occurred due to the focus state at the time of exposure or some other cause.

The ΔCD management apparatus 28 has a CPU 90 which acquires, from the focusing mechanism 26, pose information (trace data) of the wafer W whose area (one of a series of surface portions) including the n-th point in individual shot areas SA13, SA14 and so forth has been adjusted by the main control system 27. The CPU 90 stores the pose information of the wafer W in a memory 91 as a data storage section in association with preacquired surface shape information (flatness data) of the exposure area on the wafer W. The CPU 90 serves as image-state prediction means which predicts the state of the image of a pattern to be transferred on the wafer W based on the pose information and the surface shape information. The ΔCD management apparatus 28 is constituted by a computer which comprises an input/output interface circuit section 92, an input section (e.g., a keyboard) 93 and a display section 94 in addition to the CPU 90 and the memory 91.

At the time a single measuring shot area is scanned with respect to the exposure field 76, the CPU 90 samples the nine focus signals (pre-read data) output from the signal processor 58 in association with the nine detection signals from the pre-read sensor L1 or L5 at a predetermined timing, e.g., every time the wafer W moves 1 mm in the scanning direction. The individual pieces of pre-read data (surface position information) obtained from the sampling are sequentially stored in the memory 91.

Figure 12:
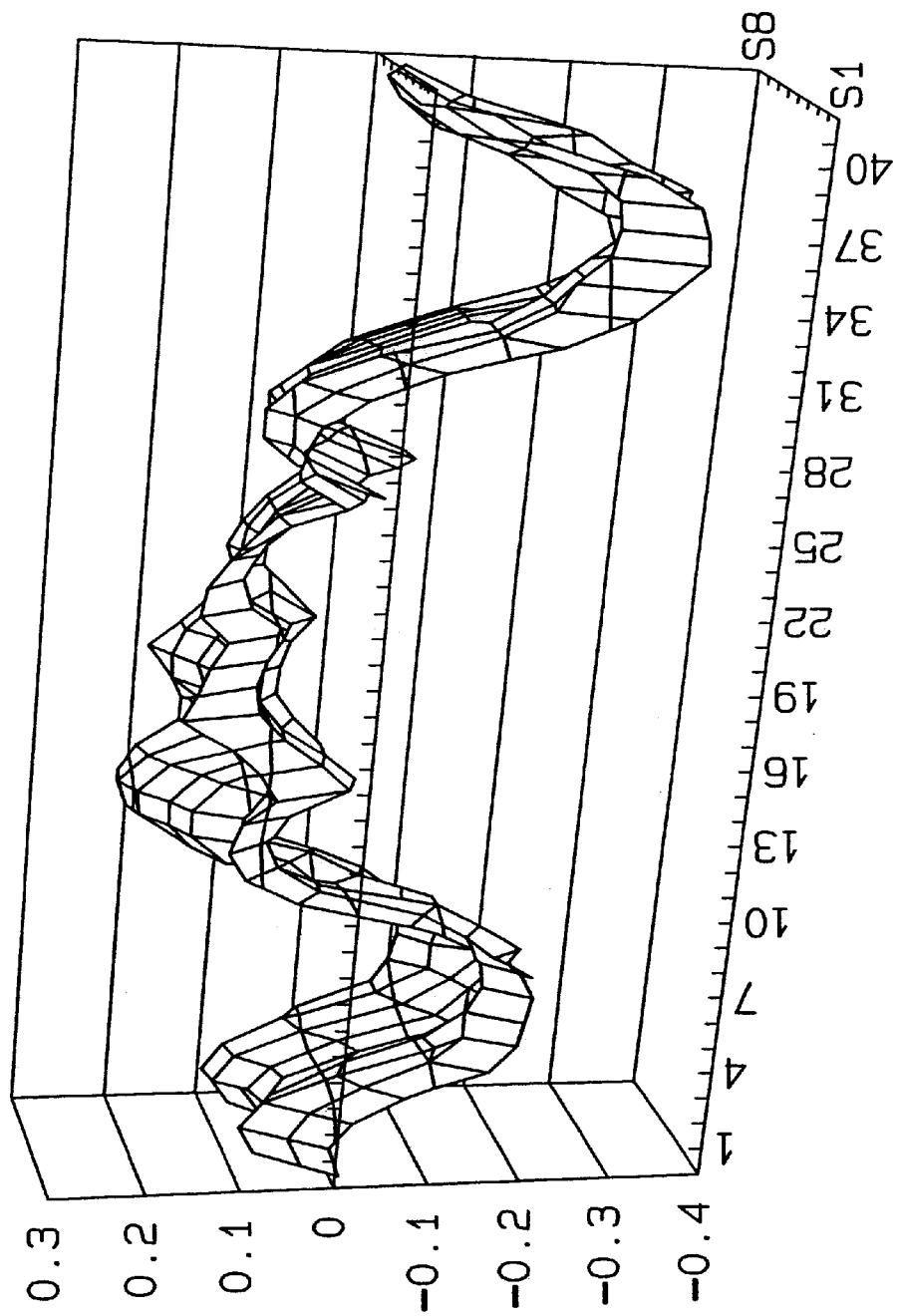
FIG. 12 is a graph showing a device topography of a single shot area.

The CPU 90 also acquires the surface shape information (flatness data) of each measuring shot area during or before scanning exposure. The details of the flatness data will be given later. A flatness-data acquiring section 95 stores the flatness data in the memory 91 in association with the X and Y coordinates of the wafer W. A graph generating section 102 generates the flatness data (device topography) of each measuring shot area in the form of a three-dimensional graph as shown in FIG. 12, a contour graph or a numerical table. The display section 94 displays the graphs and the like by retrieving.

The CPU 90 acquires, as trace data, the pose of each pre-read area in each measuring shot area SA13, SA14 or the like which indicates in what pose the area has been exposed at a position shifted by a predetermined distance of, for example, 4 mm from the pre-read position. The trace data is acquired from the sampling data of the aforementioned nine detection signals at the time of exposure. Specifically, the trace data includes Z, pitch and roll control target values that are acquired from the nine detection signals pre-read at the pre-read distance of 4 mm and the amounts of Z, pitch and roll trace errors that are computed by obtaining differences between data pre-read at the pre-read distance of 4 mm and saved and real-time data acquired when advanced by 4 mm. Provided that measured values at individual measuring points AF11 to AF59 are denoted by Z11 to Z59, equations for computing the Z, pitch and roll control target values and Z, pitch and roll trace errors are given below.

(i) A Z control target value Z_targ is computed from the following equation 1.

$$Z\_targ=(Z\_targ1+Z\_targ2+Z\_targ3)/3-Pt\_cmp \quad (1)$$

where

Pt cmp=inclination (device variable) of the wafer table with respect to the image surface of the projection lens×4 mm.

Z_targ1=average value of used sensors in (Z11, Z21, Z31)

Z_targ2=average value of used sensors in (Z15, Z25, Z35)

Z_targ3=average value of used sensors in (Z19, Z29, Z39)

(ii) A roll control target value R_targ is computed from the following equation 2.

$$R\_targ=(Z11+Z21+Z31)/3-(Z19+Z29+Z39)/3 \quad (2)$$

(iii) A pitch control target value P_targ is computed from the following equation 3.

$$P\_targ=(Z11+Z15+Z19)/3-(Z31+Z35+Z39)/3 \quad (3)$$

(iv) A Z trace error value Ztrace_err is computed from the following equation 4.

$$Ztrace_{13}\ err=Z\_check2-\{(Z\_check1)'-(Z\_targ)'\} \quad (4)$$

where

Z_check1 for first checking of Z is $$Z\_check1=(Z11+Z15+Z19+Z21+Z25+Z29)/6-Pt\_cmp1,$$

Z_check2 for second checking of Z is $$Z\_check2=(Z21+Z25+Z29+Z39+Z35+Z31)/6-Pt\_cmp2,$$

(Z_check1)' is a computed value of (Z_check1) delayed by (4 mm/scan speed), (Z_targ)' is a computed value of (Z_targ) delayed by (4 mm/scan speed), Pt_cmp1=inclination (device variable) of the wafer table with respect to the image surface of the projection lens×6 mm, and Pt_cmp2=inclination (device variable) of the wafer table with respect to the image surface of the projection lens×2 mm.

(v) A roll trace error value R_error is computed from the following equation 5.

$$R\_error=R\_check2-\{(R\_check1)'-(R\_targ)'\} \quad (5)$$

where

R_check1 for first checking of R is $$R\_check1=(Z11+Z21)/2-(Z19+Z29)/2,$$

R_check2 for second checking of R is $$R\_check2=(Z21+Z31)/2-(Z29+Z39)/2,$$

(R_check1)' is a computed value of (R_check1) delayed by (4 mm/scan speed), and (R_targ)' is a computed value of (R_targ) delayed by (4 mm/scan speed).

(vi) A pitch trace error value P_error is computed from the following equation 6.

$$P\_error=P\_check2-\{(P\_check1)'-(P\_targ)'\} \quad (6)$$

where

P_check1 for first checking of P is $$P\_check1=(Z11+Z15+Z19)/3-(Z21+Z25+Z29)/3,$$

P_check2 for second checking of P is (P_check1)' is a computed value of (P_check1) delayed by (4 mm/scan speed), and (P_targ)' is a computed value of (P_targ) delayed by (4 mm/scan speed)

Those pieces of trace data (the Z, pitch and roll control target values and Z, pitch and roll trace errors) are sequentially stored in the memory 91 in association with the flatness data.

Figure 15:
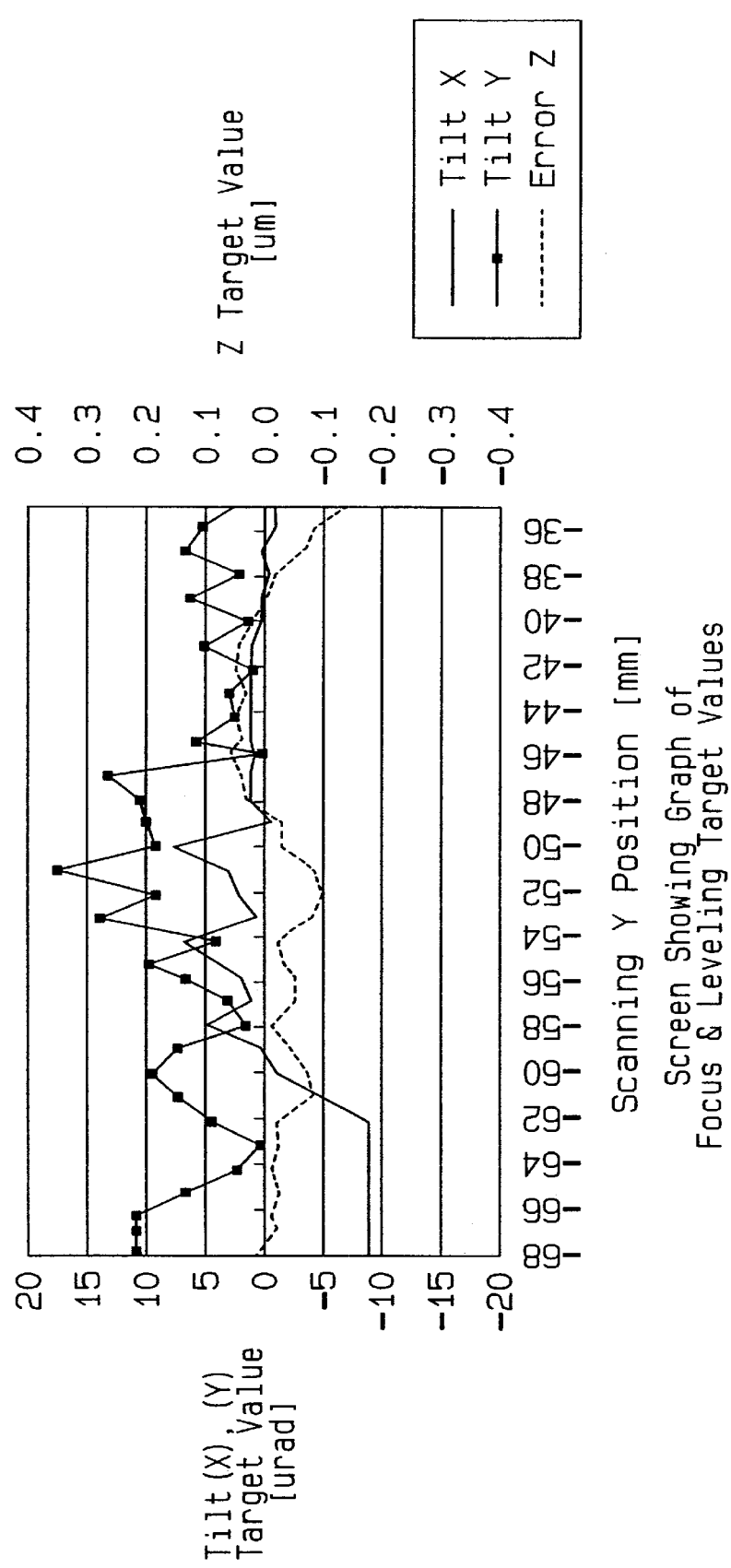
FIG. 15 is a graph showing target values of individual portions in a single shot area at the time of exposure.

The graph generating section 102 generates a graph as shown in FIG. 15, which two-dimensionally shows the control target values (target position), from the stored trace errors.

The CPU 90 adds the ZT trace (Z, roll and pitch trace errors) to the shot flatness to compute a Z average offset Zave(x1, y, w1, s1) which is an average offset value in the Z direction originated from the trace errors between the time when an arbitrary point in a shot enters an exposure slit area to tho time when the point leaves that area. In the Z average offset, w1 means a wafer number 1 and s1 means a shot number 1.

More specifically, the Z average offset Zave(x1, y) is an average value of Z-directional trace deviations between the time when a point in the shot (x1, y) enters the exposure slit area to the time when the point leaves that area, and can be expressed by the following equation 7.

$$Zave(x1, y) = \sum_{j=y-n}^{y+n} [Z(j) + Tx(j)*x1 + Ty(j)*am(y-j) - Flt(x1, Y)]/m \quad (7)$$

where y is the scan Y coordinate in a shot (when the exposure area has a size of 33 [mm], y=0 to 41 [mm] from 33±n [mm]), m is the number of pieces of data when data is acquired in the slit width from the center position of the exposure slit (m=9 with the y pitch=1 [mm]), n is the number of pieces of data in the slit width on one side (excluding the center position of the exposure slit) (n=(m−1)/2; with the y pitch=1 [mm], n=4 as m=9), am is the Y-directional distance from the center position of each exposure slit in a shot (am(jp)=jp), Z(j) is the Z target position+Z trace error at a position j in the scanning direction in a shot, Tx(j) is the roll target position+roll trace error at a position j in the scanning direction in a shot, Ty(j) is the pitch target position+pitch trace error at a position j in the scanning direction in a shot, Flt(x1, y) is the flatness at coordinates (x1, y) in a shot, jp, which is a data counter, is jp=−(m−1)/2 to (m−1)/2 (with the y pitch=1 [mm], jp=−4 to 4 as m=9), and x1 is a coordinate in the exposure slit area.

At the time of measuring the dynamic flatness, the X pitch of an AF sensor used in the measurement is designated. With the X pitch being 2.9 [mm], the maximum number of measuring points is nine. At the time of measuring the static flatness, the upper limit of the pitch is normally 0.5 [mm] (51 measuring points).

Further, the CPU 90 adds the trace error of the ZT trace (roll, pitch and Z deviations) to the device topography (shot flatness) measured by the main AF sensor to thereby compute a Z-directional standard deviation Zmsd(x1, y) originated from the trace errors between the time when an arbitrary point in a shot enters an exposure slit area to the time when the point leaves that area.

More specifically, Zmsd(x1, y) is a Z standard deviation in the exposure slit at a position (x1, y) in a shot and can be expressed by the following equation 8.

$$Zmsd(x1, y) = \sqrt{\sum_{j=y-n}^{y+n} \{Z(j) + Tx(j)*x1 + Ty(j)*am(y-j) - (Flt(x1, y) - Zave(x1, y))\}^2 / m} \quad (8)$$

where

Zave(x1, y) is an average value of Z-directional trace deviations between the time when a point in the shot (x1, y) enters the exposure slit area to the time when the point leaves that area, y is the scan Y coordinate in a shot (when the exposure area has a size of 33 [mm], y=0 to 41 [mm] from 33±n [mm]), m is the number of pieces of data when data is acquired in the slit width from the center position of the exposure slit (m=9 with the y pitch=1 [mm]), n is the number of pieces of data in the slit width on one side (excluding the center position of the exposure slit) (n=(m−1)/2; with the y pitch=1 [mm], n=4 as m=9), am is the Y-directional distance from the center position of each exposure slit in a shot (am(jp)=jp), Z(j) is the Z target position+Z trace error at a position j in the scanning direction in a shot, Tx(j) is the roll target position+roll trace error at a position j in the scanning direction in a shot, Ty(j) is the pitch target position+pitch trace error at a position j in the scanning direction in a shot, Flt(x1, y) is the flatness at coordinates (x1, y) in a shot, jp, which is a data counter, is jp=−(m−1)/2 to (m−1)/2 (with the y pitch=1 [mm], jp=−4 to 4 as m=9), and x1 is a coordinate in the exposure slit area.

At the time of measuring the dynamic flatness, the X pitch of an AF sensor used in the measurement is designated. With the X pitch being 2.9 [mm], the maximum number of measuring points is nine. At the time of measuring the static flatness, the upper limit of the pitch is normally 0.5 [mm] (51 measuring points).

The CPU 90 computes the variation amount ΔCD of the exposure line width in each measuring shot area from the operation of (prestored designed line width—measured line width) in a line-width-variation computing section 100. The measured line width is acquired by causing a measuring unit, such as a scanning electron microscope (SEM) to measure the exposure line width of the pattern of each shot area SA13, SA14 or the like after exposure of all the shot areas on the wafer W is completed. The exposure line width may be measured by using an optical critical dimension (CD) measurement method, as disclosed in U.S. Pat. No. 6,094,256. Wedge mark CD magnification technique uses double exposure as shown schematically in FIG. 19(A). Half the nominal exposure energy is given each time. The wedge length is measured using "Laser Scanning Alignment (LSA) sensor" which scans the laser beam spot along the length direction of the wedge and receives the intensity of the scattered light coming from it. Designed dimensions are shown in FIG. 19(B) and their relationship is expressed in the equation (10). The angle θ is set to satisfy the equation (11). Thus, the geometric magnification ratio is "50". Applicants have the comparison between the OCD and SEM measurement results. The comparison is made after 54 data averaging. The OCD method reads the wedge length while the SEM observation reads the wedge width. The mutual difference is the order of a few nano meters.

$$L = \frac{(CD1 + CD2)}{\sin\theta} \cos\left(\frac{\theta}{2}\right) \quad (10)$$

$$L = 25 * (CD1 + CD2) \quad (11)$$

A simple binary distribution of the defocus error can yield almost the same result as other more complicated defocus distributions. Therefore, Applicants have chosen binary distribution for verification work. If the simple binary distribution of defocus is realized by exposing twice in different focus point, this may require tight alignment accuracy because the miss-alignment degrades the CD. If the binary distribution is combined with wedge mark CD magnification technique, it will require four times exposure as well as the tight alignment accuracy control as shown in FIG. 19(B). The CD in first focus point is shown as CD1 and the CD in second focus point is shown as CD2. After taking four times exposure, the wedge shape is formed and the length of the wedge marl L1 becomes measurable.

As one alternative method, Applicants investigated the applicability of the staggered focus offset exposure to OCD method. As shown in FIG. 19(C), this method requires two exposures in different focus offset to form CD1 and CD2. Due to the self-alignment nature of the wedge mark, there is no alignment error related CD errors. Applicants have done aerial image simulation to compare the both cases shown FIGS. 19(B) and 19(C). The condition of the simulation is as follows; projected pattern=150 nm isolated line, $\lambda$=248 nm, NA=0.68, $\sigma$=0.85 conventional illumination. Mask bias is not introduced. As above mentioned the difference between them is small, though it can be corrected on contour map.

Figure 17B:
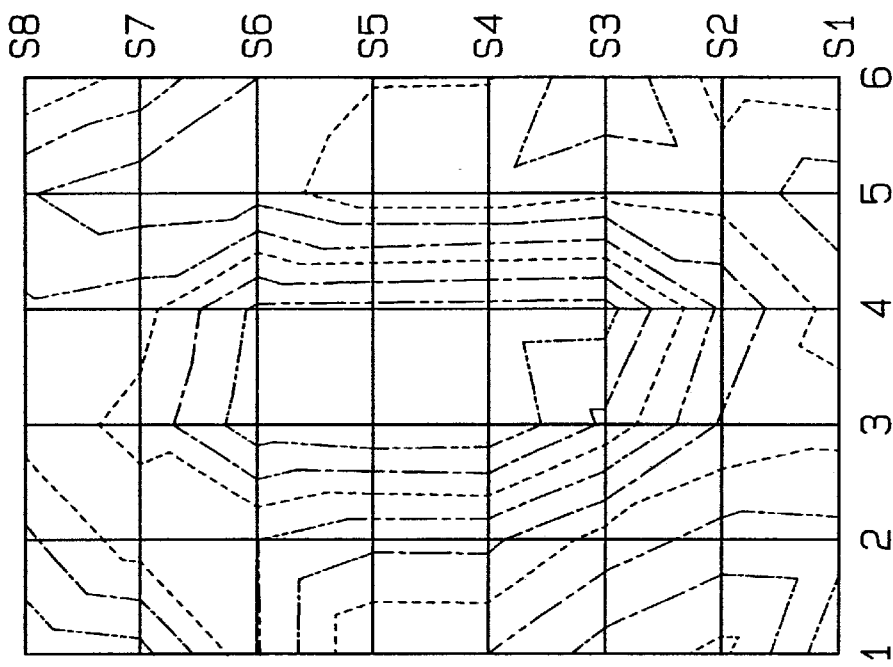
FIG. 17B is a graph showing the variation amount ΔCD in the form of contour lines.
Figure 17A:
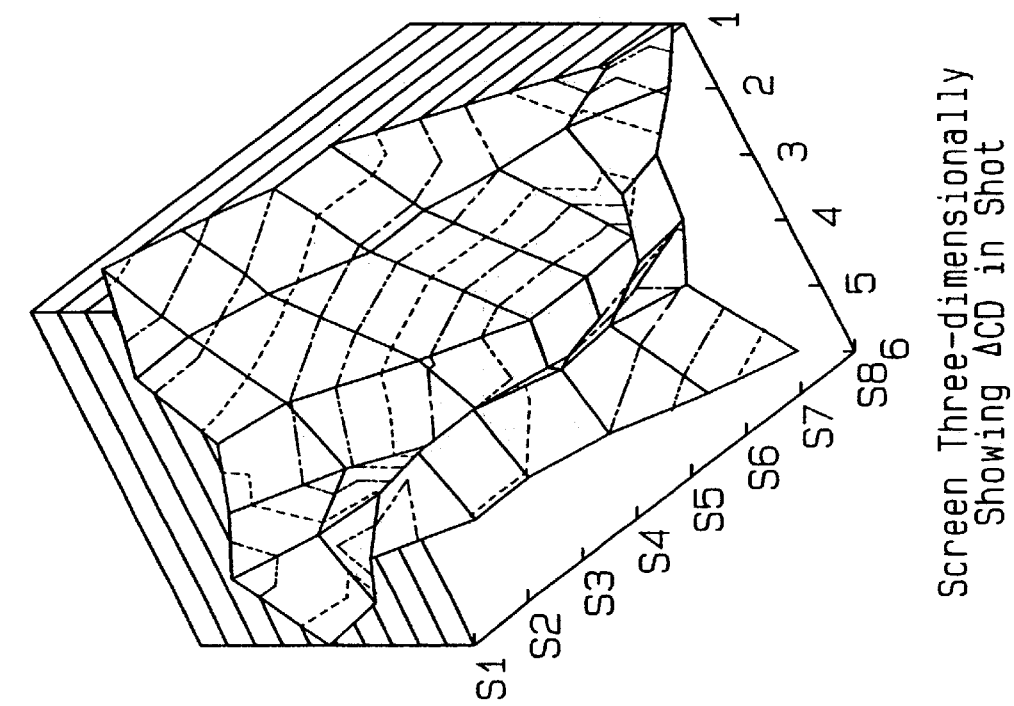
FIG. 17A is a graph two-dimensionally showing a variation amount ΔCD of exposure line widths of individual portions in a single shot area.

The measured line widths of the individual shot areas obtained in the above manner are entered by the input section 93 and are stored in the memory 91. The graph generating section 102 generates a graph as shown in FIG. 17 three-dimensionally showing the variation amount $\Delta CD$ of the exposure line width calculated by the line-width-variation computing section 100. The variation amount $\Delta CD$ may be shown in the form of a contour graph or a numerical table. The graphs of the variation amount $\Delta CD$ of the exposure line width can be displayed on the display section 94 by retrieving.

The operation of the scanning exposure apparatus according to the present embodiment will be discussed below.

To begin with, a description will be given of an exposure process for other shot areas SA11, SA12, . . . , SA55 and SA56 than eight measuring shot areas SA13, SA14, SA26, SA21, SA31, SA36, SA53 and SA54 in a plurality of shot areas SAij shown in FIG. 4. The former shot areas will be simply called "shot areas" in the following description in order to distinguish them from measuring shot areas.

In each shot area, a circuit pattern on a mask M is sequentially exposed while synchronously scanning the mask M and the wafer W with respect to the exposure field 76 as done in the conventional scanning exposure apparatus. Specifically, as shown in FIG. 2, the Y-directional pre-read sensor L1 comprising a plurality of photosensors (which respectively correspond to the measuring points AF11, AF15, AF19, AF21, AF25, AF29, AF31, AF35 and AF39) pre-reads an area 76' (a pre-read area located ahead by 4 mm) located in front of the exposure field 76 of a single shot area in the scanning direction. When this pre-read area is shifted by a predetermined amount (e.g., 4 mm), the Z-leveling stage 42 is moved to the control target position (roll, pitch and Z-directional height) that is computed based on the pre-read data acquired at the pre-reading time.

As such pre-reading and the controlled movement of the Z-leveling stage 42 are repeated every predetermined time, the circuit pattern is exposed in that shot area. Alternatively, in the exposure process for each shot area, the control target position of one area may be obtained immediately prior to exposure without performing pre-reading and the Z-leveling stage 42 may be moved to that position.

Figure 8:
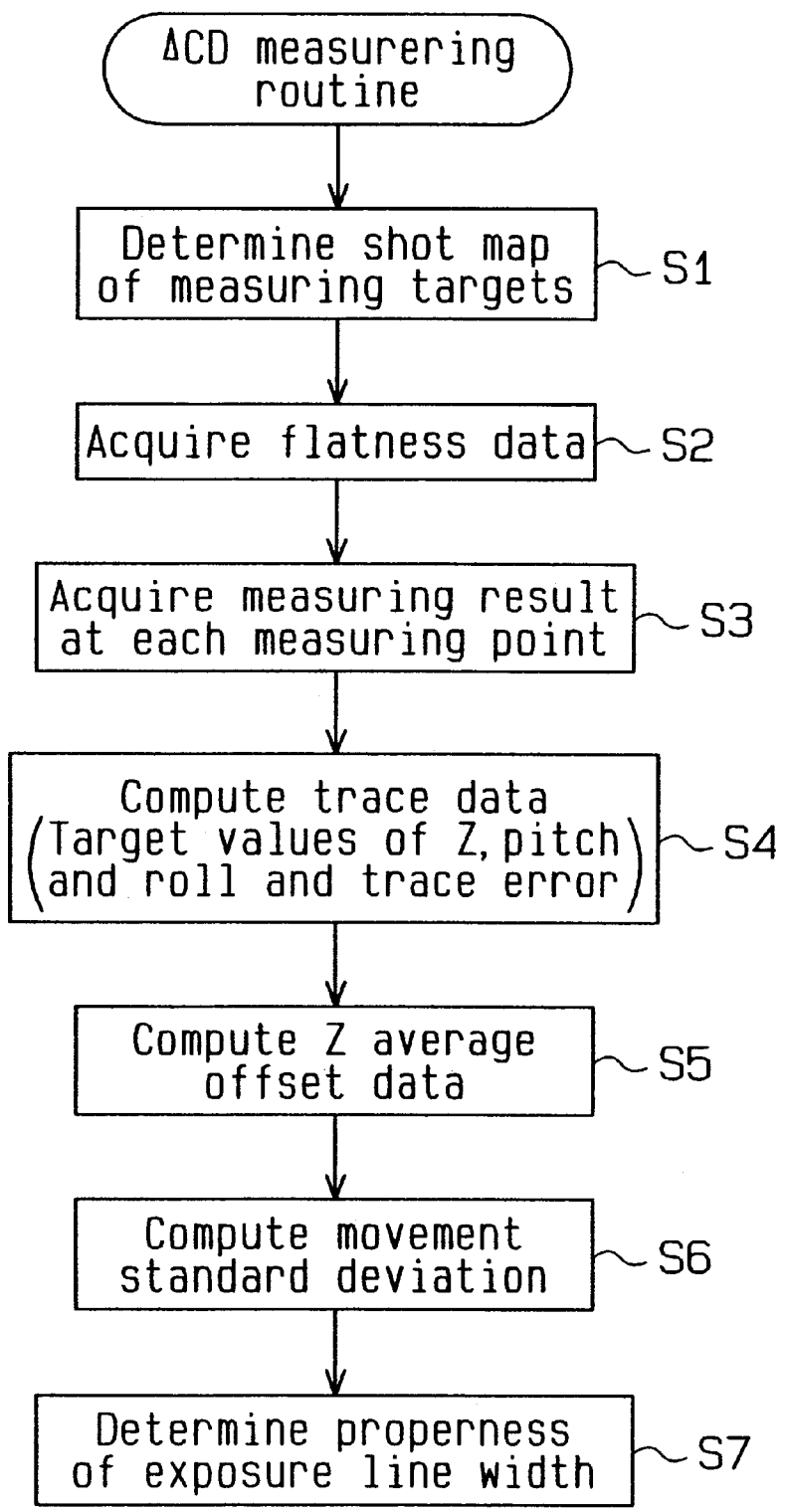
FIG. 8 is a flowchart illustrating a ΔCD measuring process sequence.
Figure 9:
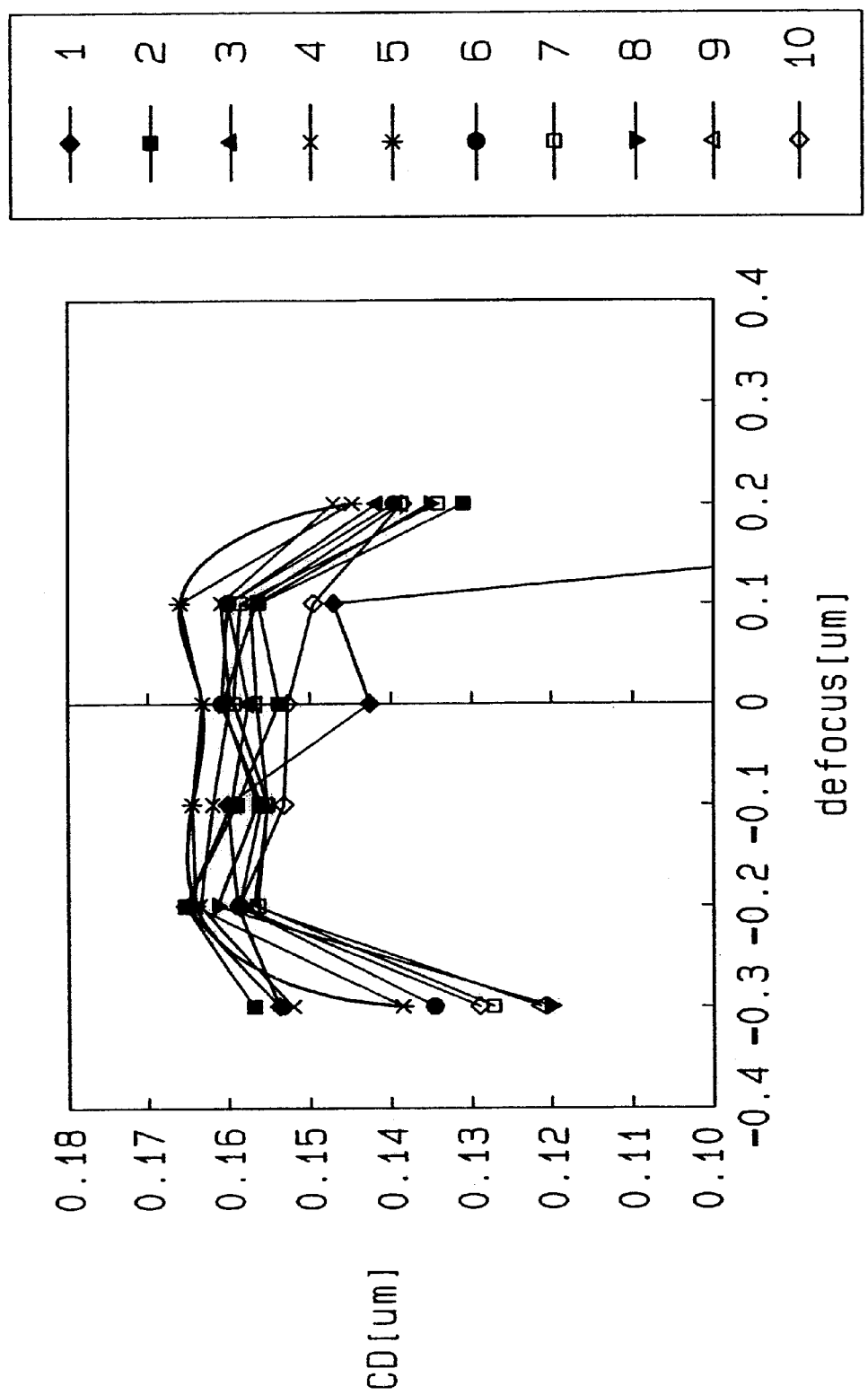
FIG. 9 is a graph showing CD defocus data.

With reference to FIGS. 8 to 10, a description will now be given of the exposure process that is performed on each measuring shot area SA13, SA14 or the like and the $\Delta CD$ measuring process that is performed during this exposure process.

First, the exposure process that is performed on each measuring shot area is similar to the exposure process that is performed on each shot area (SA11, SA12, . . . , SA55 or SA56).

That is, in each measuring shot area, the circuit pattern on the mask M is sequentially exposed while synchronously scanning the mask M and the wafer W with respect to the exposure field 76.

During this exposure process, a $\Delta CD$ measuring process sequence to be discussed below is executed in each measuring shot area.

($\Delta CD$ Measuring Process Sequence)

(Step 1) Determination of the Shot Map of $\Delta CD$ Measuring targets (Step S1 in FIG. 8)

Measuring shot areas SA13, SA14 and so forth which are measuring targets for $\Delta CD$ (variation amount of the exposure line width) are automatically or manually designated from a plurality of shot areas shown in FIG. 4. In the case of automatic designation, EGA measuring shot areas or predetermined exclusive shot areas are selected.

(Step 2) Acquisition of Flatness Data (Step S2 in FIG. 8)

The surface shape information (flatness data) that has a step or the like of a measuring shot area is acquired during or before exposure. The flatness data may be acquired by any of the following three ways.

(i) Static Wafer Flatness Measurement (Which Measures the Flatness Beforehand Using a Wafer Flatness Function)

The flatness of each shot is measured by the center sensor in the exposure field 76 (the sensor corresponding to the measuring point AF35) using the static wafer flatness function. The measuring pitches in both X and Y directions can be designated arbitrarily.

(ii) Shot Flatness Measurement in Pre-scan

After auto-focus (AF) in the center of each shot, the shot scan is performed without AF/AL control and detection values are acquired from nine sensors (corresponding to the measuring points AF31 to AF39) in the center row in the exposure slit. The flatness is measured from the sensor values. It is assumed here that the offset between the sensors has been compensated previously.

(iii) Shot Flatness Measurement During Exposure

As the maximum number of AF sensors that can read simultaneously is currently 3×3=9, the top three sensors (which correspond to AF11, AF15 and AF19) are used. Although stage control is not normally performed at the time of measuring the flatness, the Z-directional height, roll and pitch of each stage are controlled during exposure. To separate the flatness component in a shot, therefore, the stage drive encoder values of the Z-directional height, roll and pitch are subtracted from the AF trace data, as indicated in an equation 9 below.

In the case of the top sensor Sns1 selected for the control purpose, the shot flatness of the row to which Sns1 belongs is acquired from the following equation 9.

$$Flt\_sns\_1(x1, y, w1, s1) = Z\_aftr(x1, y, w1, s1) - Tx\_enc(y, z, w1, s1)*x1 - Ty\_enc(y, w1, s1)*y1 - Z\_enc(y, w1, s1) \quad (9)$$

where
- (x1, yl) are the coordinates of the sensor from the center of the slit,
- Z_attr(x1, y, w1, s1) is the AF trace of the sensor 1 selected for the shot 1 on the wafer 1, and
- Z_enc(y, w1, s1), Tx_enc(y, z, w1, s1) and
- Ty_enc(y,w1,s1) are encoder traces during exposure on the shot 1 on the wafer 1. It is to be noted that the origin is reset when the first row of sensors lie over the shot 1.

In the case of the current arrangement of three rows of sensors, Flt_sns_2 (x2, y, w1, s1) and Flt_sns_3 (x3, y, w1, s1) are likewise acquired. It is also assumed that the offset between the sensors has been compensated previously.

The flatness-data acquiring section 95 stores those pieces of flatness data in the memory 91 in association with the X and Y coordinates of the wafer W. The graph generating section 102 generates the flatness data (device topography) of each measuring shot area in the form of a three-dimensional graph as shown in FIG. 12, a contour graph or a numerical table. The display section 94 displays a retrieved one of the graphs and tile like.

(Step 3) Acquisition of the Measuring Result at Each Measuring Point (Step S3 in FIG. 8)

The CPU 90 acquires, through sampling, focus signals corresponding to the Z-directional heights of the measuring points AF11, AF15, AF19, AF21, AF25, AF29, AF31, AF35 and AF39 in the pre-read area 76' of the exposure field 76. This sampling is executed every time the wafer W moves by a predetermined distance (e.g., 1 mm)

(Step 4) Computation of Trace Data (Z, Pitch and Roll Control Target Values and Z, Pitch and Roll Trace Errors) (Step S4 in FIG. 8)

Figure 16:
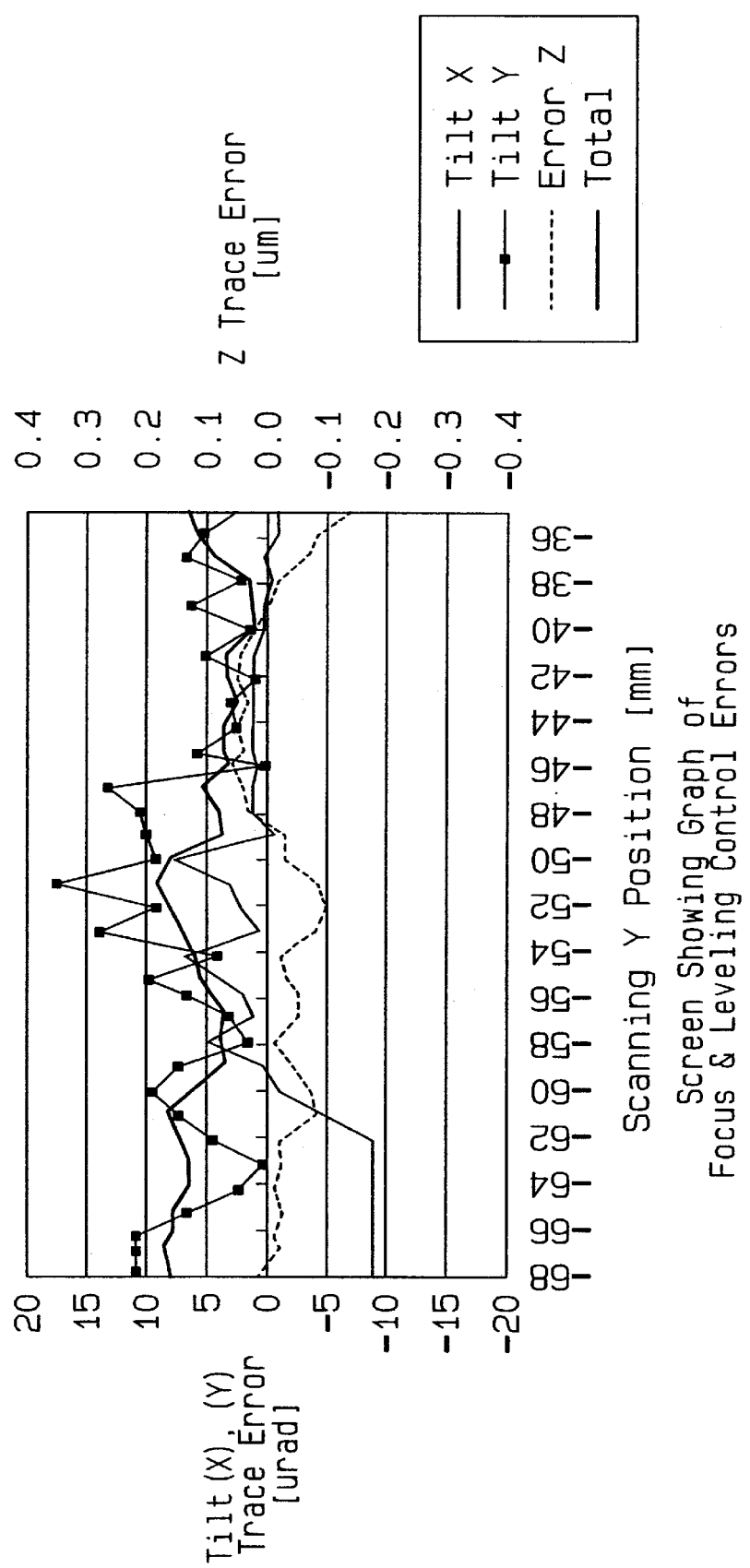
FIG. 16 is a graph showing trace errors of individual portions in a single shot area at the time of exposure.

Next, the CPU 90 acquires the Z, pitch and roll control target values when each pre-read area goes to the exposure field and Z, pitch and roll trace errors (roll, pitch and Z-directional deviation amounts) when that area actually reaches the exposure field, one after another in accordance with sampling. The trace data acquired in this manner is stored in the memory 91 in association with the flatness data, i.e., for each of the same X and Y coordinates of the wafer W as those of the flatness data. The control target values in the individual measuring shot areas are displayed in the form of a two-dimensional graph as shown in FIG. 15, and the trace errors of the individual portions are also displayed in the form of a two-dimensional graph as shown in FIG. 16.

(Step 5) Computation of Z Average Offset Data (Step S5 in FIG. 8)

The Z average offset is acquired by adding the trace errors computed in step S4 to the flatness data of the individual measuring stol areas acquired in step S2 as described above (see FIG. 10A). As the details have already been given earlier, the description will not be repeated.

The Z average offset obtained shows in what pose each portion in each measuring shot area has passed with respect to the exposure field 76.

Figure 13:
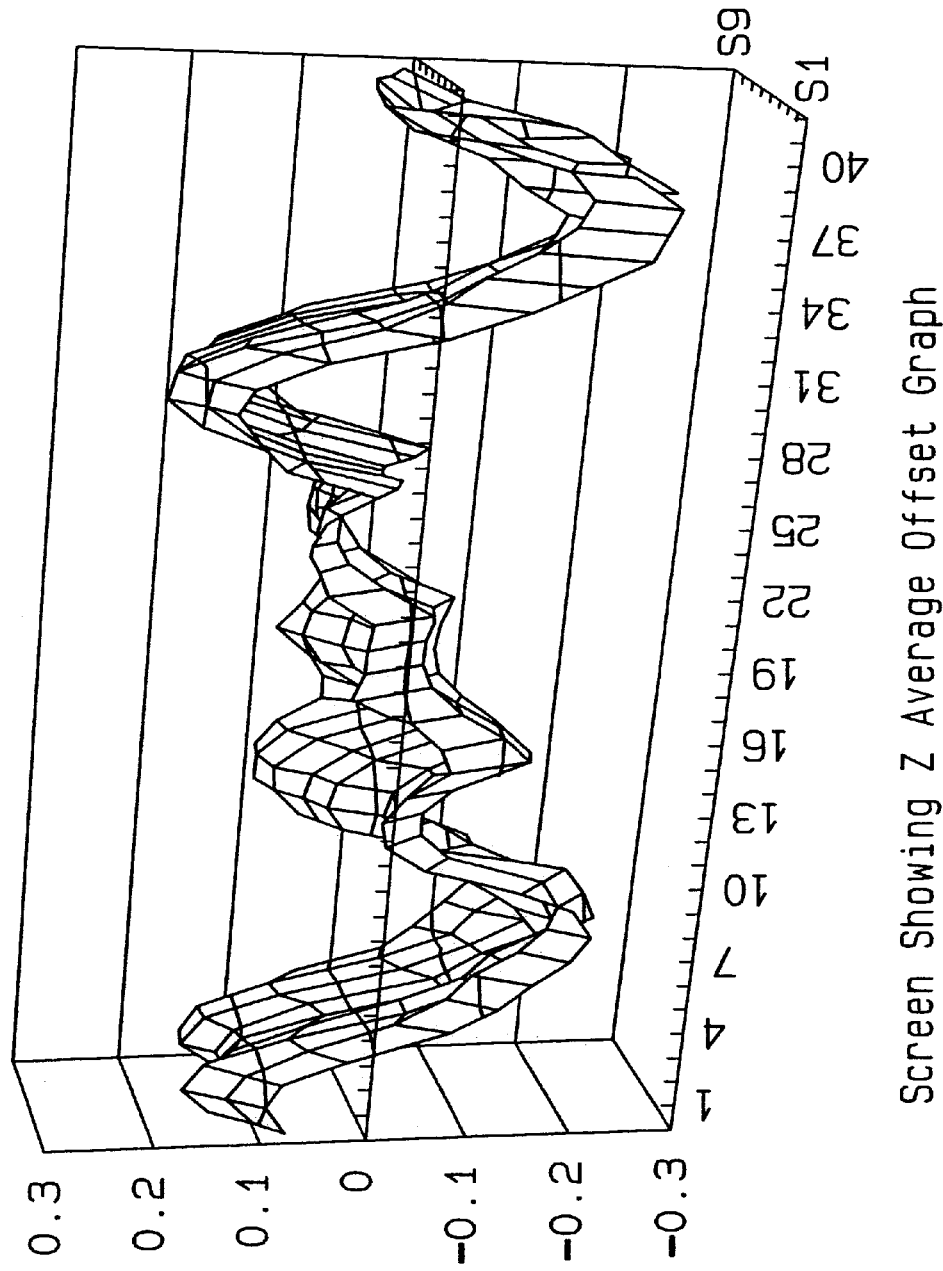
FIG. 13 is a graph showing a Z average offset of a single shot area.

The Z average offsets of a series of consecutive surface portions (surface portions having the slit width of the exposure field 76) in a single measuring shot area are acquired one after another in the above-described manner, and are stored in the memory 91. Those pieces of the Z average offset data stored are displayed in the form of a three-dimensional graph as shown in FIG. 13.

(Step 6) Computation of the Movement Standard Deviation (Step S6 in FIG. 8)

Next, the CPU 90 causes a movement-standard-deviation computing section 99 to calculate, from the equation 2, a standard deviation (movement standard deviation) Zmsd of a Z-directional trace deviation between the time when an arbitrary point in the measuring shot area enters the exposure field 76 to the time when the point leaves that field.

Figure 14:
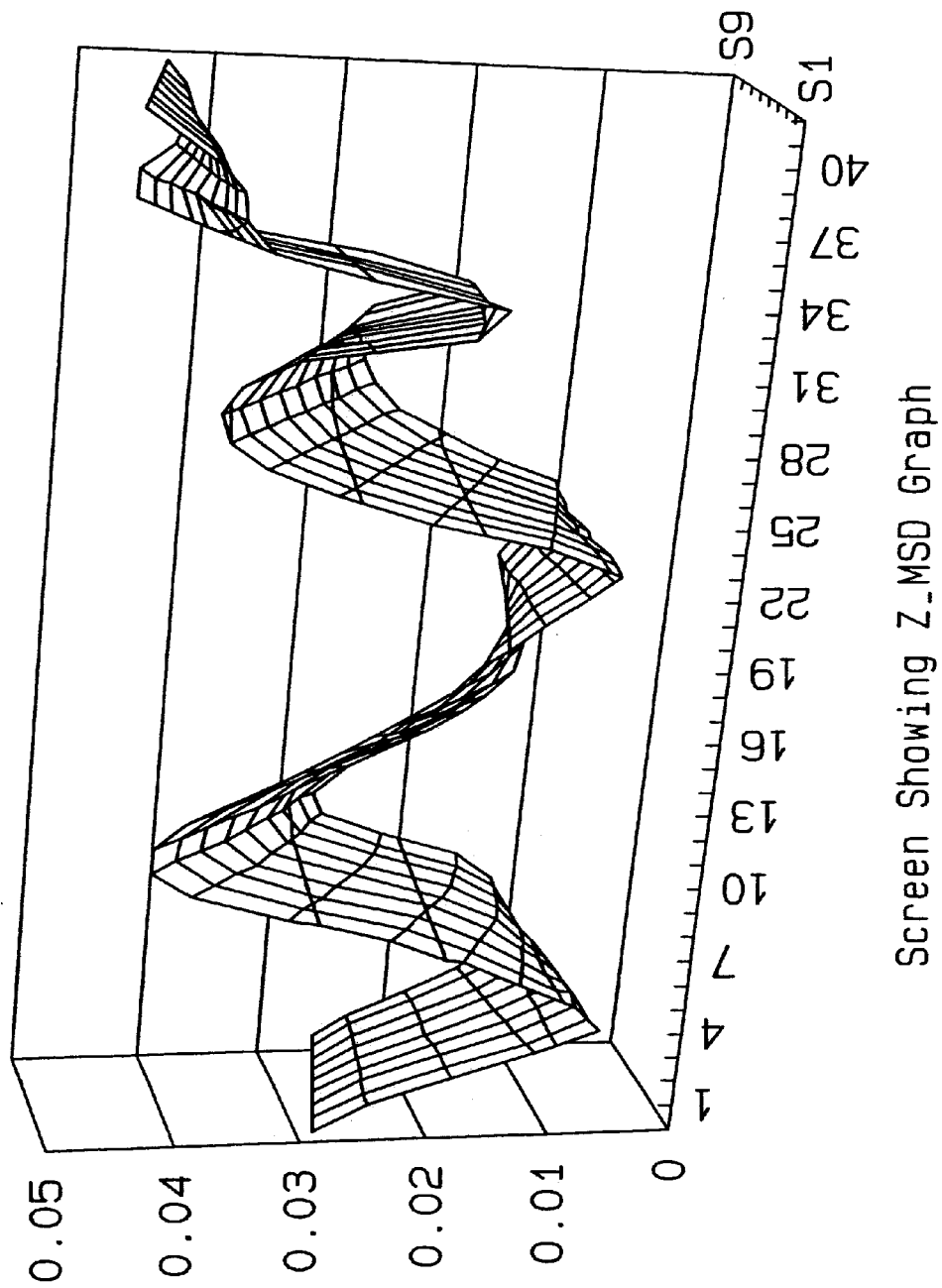
FIG. 14 is a graph showing a movement standard deviation of a single shot area.

The movement standard deviations of a series of consecutive surface portions (surface portions having the slit width) in a single measuring shot area are acquired one after another in the above manner, and are stored in the memory 91. The stored movement standard deviations are displayed in the form of a three-dimensional graph as shown in FIG. 14. The stored movement standard deviations may be displayed in the form of a two-dimensional graph or a numerical table.

(Step 7) Determine the Properness of the Exposure Line Width (Step S7 in FIG. 8)

(a) One way to determine the properness of the exposure line width will be discussed below.

The expected variation amount ΔCD of the exposure line width in each measuring shot area is seen by collating the Z average offsets and movement standard deviations, both acquired during exposure of the individual measuring shot areas and stored in the memory 91, with old stored data during exposure or after exposure of all of the shot areas SAij is completed. When a line-width properness determining section 101 decides that the variation amount is equal to or greater than a given value or exceeds a predetermined allowable range, warning can be generated by displaying a warning indication or the like on the display section 94 if it is during exposure. Alternatively, a signal may be sent to the main control system 27 of the scanning exposure apparatus 21 to stop the exposure process. When the value of a variation in line width actually measured by an SEM or the like after exposure is greater than a variation value originated from the focus error (the focus state at the time of exposure) that is kept as old data, for example, it is understood that the variation in exposure line width has originated from other causes than the focus error.

(b) The following discusses another way to determine the properness of the exposure line width After exposure of the entire shot areas SAij shown in FIG. 4 is completed, the exposure line width of the pattern formed in each measuring shot area is measured using a measuring unit, such as an SEM, and the measured line widths of the individual measuring shot areas are input to the ΔCD management apparatus 28 through the input section 93.

The line-width-variation computing section 100 computes the variation amount ΔCD of the exposure line width of each measuring shot area from the difference between the input measured line width of each measuring shot area and the designed line width of the pattern prestored in the memory 91. The variation amount ΔCD of the exposure line width computed for each shot area is stored in the memory 91.

When the variation amount of the exposure line width of one measuring shot area is equal to or greater than a given value, the line-width properness determining section 101 decides that the variation in exposure line width has originated from other causes than the focus error and displays a warning or the like on the display section 94.

The variation amount ΔCD of the exposure line widths of the individual measuring shot areas are three-dimensionally displayed as shown in FIG. 17 by the graph generating section 102. It is seen at a glance from this graph how much the exposure line width varies at each portion of each measuring shot area.

Figure 18:
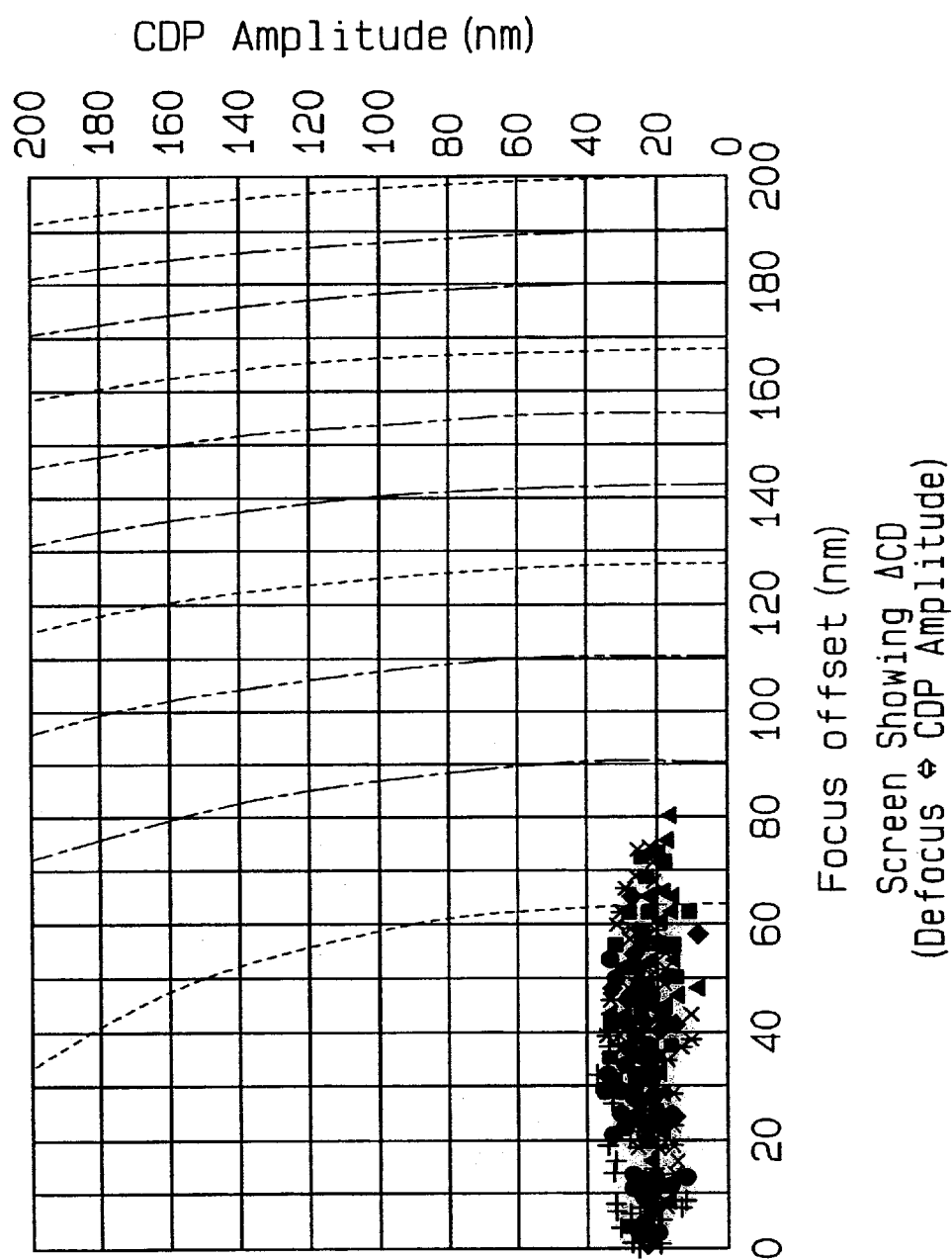
FIG. 18 is a graph showing the relationship among a Z average offset, a movement standard deviation (CDP Amplitude) and an exposure line width.

The graph shown in FIG. 18 shows the amount of defocus on the horizontal scale and the movement standard deviation Zmsd on the vertical scale and shows the exposure line width in the form of contour lines. The graph shows that for the designed line width of 180 nm, when the defocus amount and the movement standard deviation Zmsd are both small, the measured value of the exposure line width (measured line width) of each portion in the measuring shot area actually exposed mostly lies within the contour lines of 175 to 180 nm.

Although the value of ΔCD or a variation in line width with respect to the designed value is calculated and displayed in the embodiment, the value of CD or the actual exposure line width may be calculated and displayed instead.

A first modification of the first embodiment will be discussed below. The first modification uses correlation data of a defocus and a line width value or so-called CD-focus data, instead of the movement standard deviation Zmsd. The modification can acquire a CD value or ΔCD value based on a defocus corresponding to the previously acquired Z average offset (FIG. 13) at each point in a Shot and the image height of that point.

The purpose of the modification is to provide a capability of generating a ΔCD shot map based on the CD-focus data in consideration of the influence of the curved image surface of the projection lens. It is assumed that the CD-focus data is prestored as device information.

The ΔCD management apparatus 28 has capabilities of registering, editing and deleting a CD-focus table file and a graph display capability. At the time of generating CD-focus data, the defocus amount and CD value are input in the table for each image height of the projection optical system. The data then can be displayed as shown in FIG. 9. In consideration of the influence of the curved image surface of the projection lens, an approximation is prepared for each image height based on the CD-focus data. The approximation may be a linear equation, a quadratic equation or an equation of a higher order.

The number of image heights is determined based on the number of AF sensors in the X direction. At the time of measuring ΔCD, CD is computed from the approximation and an average defocus amount (no absolute value) and a ΔCD shot map is generated from the CD.

A second modification of the first amendment will be discussed below. In the second modification, the ΔCD management apparatus 28 generates a ΔCD (CD variation) map indicative of sync and dose errors. The FIGS. 20(A)–20(D) show introducing the X- and Y-sync errors to a calculation of the CD variation. FIG. 20(A) shows the CD estimation of the sample shot using CD contour map that is 110 nm isolated line simulation without sync error. FIG. 20(B) shows the CD estimation of the same shot as FIG. 20(A). This time as to CD contour map, the one that is the 110 nm isolated line simulation with sync error=10 nm in msd value is used. The actual sync error in msd value is not constant. Thus, the sync error distribution along the scan axis should be known. The snyc error distribution can be measured on scanner. At this time, the monotonous distribution as shown in FIG. 20(c) is used. This distribution is made based on the assumption that the major source of the mechanical oscillation is the stage acceleration. The amplitude of the oscillation decrease gradually as the time passes by. Linear interpolation using the sync-error distribution as a weighting function to both CD variation maps in maximum and minimum sync-errors can give a CD variation map that represent the focus and sync errors as shown in FIG. 20(D). The 3σ and P-P value in CD variation are same as shown in FIG. 20(B). In a practical use, the sync-error and dose-error distributions are very flat, and their variations or P-P value are very small. Therefore, linear interpolations are applicable.

Figure 21:
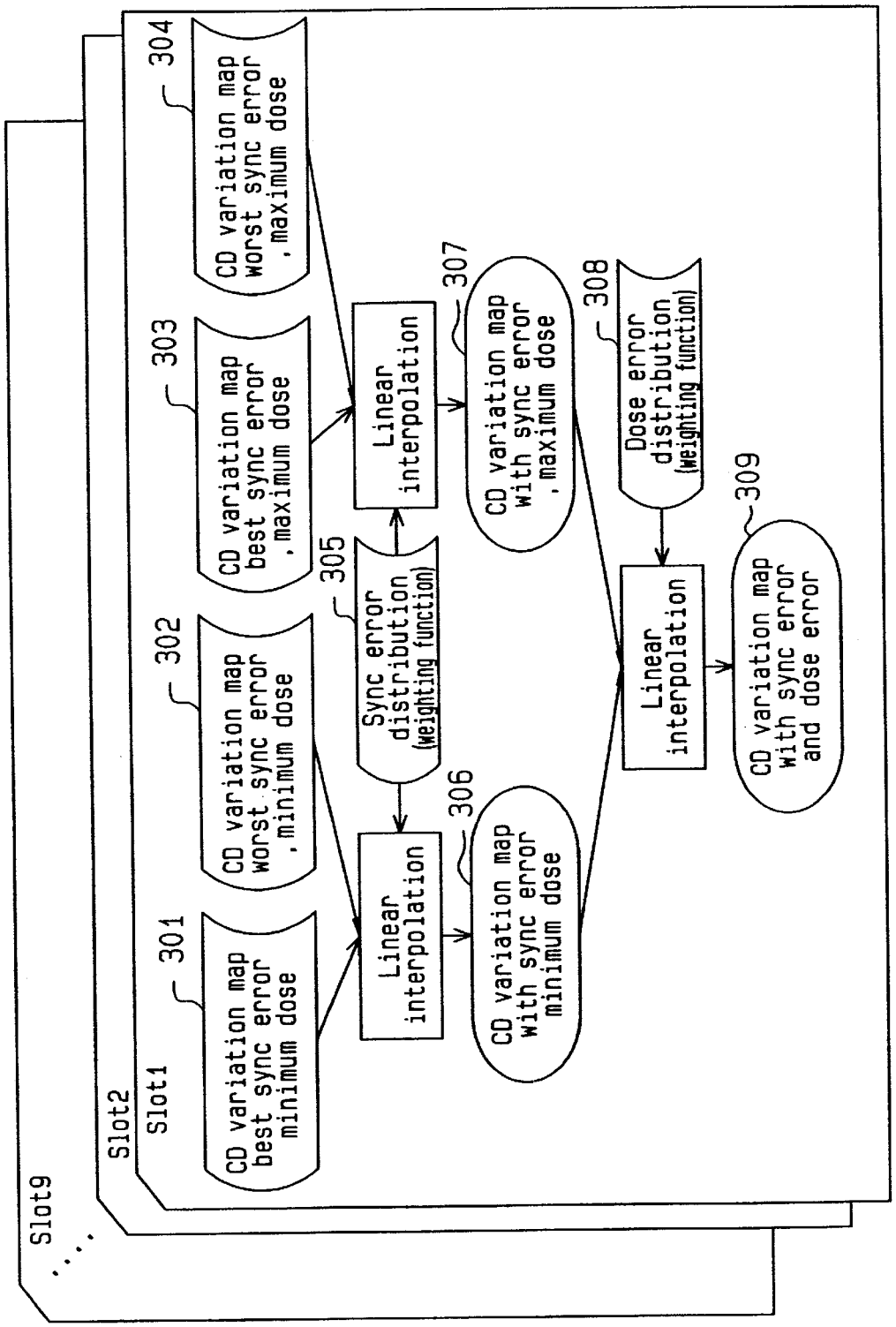
FIG. 21 is a flowchart illustrating a CD variation map generating process sequence.

As shown in FIG. 21, the CD variation map is generated using four different CD look-up tables that are converted to CD variation maps 301, 302, 303 and 304. The variation map 301 has a best sync error in minimum exposure-dose and the variation map 302 has a worst sync error in minimum exposure-dose. The variation map 303 has a best sync error in maximum exposure-dose and the variation map 304 has a worst sync error in maximum exposure-dose. A first linear interpolation is performed on the CD variation maps 301, 302 using a sync error distribution 305 as a weighting function to generate a CD variation map 306 having a sync error in minimum exposure-dose. A second linear interpolation is performed on the CD variation maps 303, 304 using a sync error distribution 305 to generate a CD variation map 307 having a sync error in maximum exposure-dose. Furthermore, a third linear interpolation is performed on the CD variation maps 306, 307 using a dose error distribution 308 along the scan axis that is used as a weighting function to generate a CD variation map 309 indicative of sync and dose errors.

The first embodiment that has the above-described structure has the following advantages.

(1) Using the pose information (trace data) of the wafer W stored in the memory 91 in association with each set of X and Y coordinates at the time of exposure in what pose the area has been exposed and the surface shape information (flatness data) of each measuring shot area on the wafer W, it is possible to see in what pose the surface of the water W to be exposed has actually been exposed with respect to the exposure field 76. When the exposure line width of the pattern varies, therefore, it is possible to determine first how much influence the focus error (focus state at the time of exposure) has exerted as a cause of varying the exposure line width. This makes it possible to promptly analyze the cause of varying the exposure line width of the pattern.

Figure 10A:
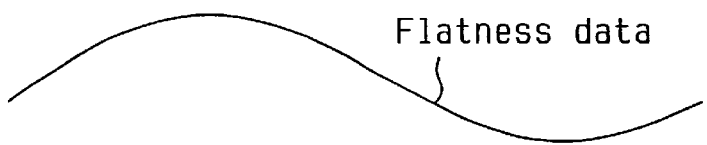
FIG. 10A is an explanatory diagram showing flatness data in a single measuring shot area.
Figure 10B:
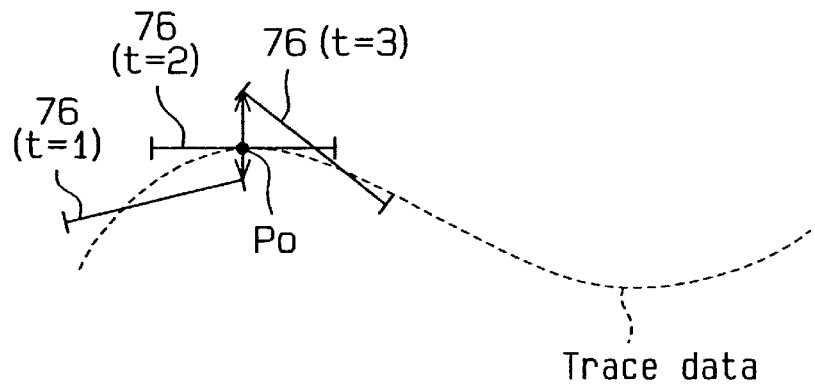
FIG. 10B is an explanatory diagram showing the relationship between an exposure field and an exposure surface at the time of exposure.
Figure 10C:
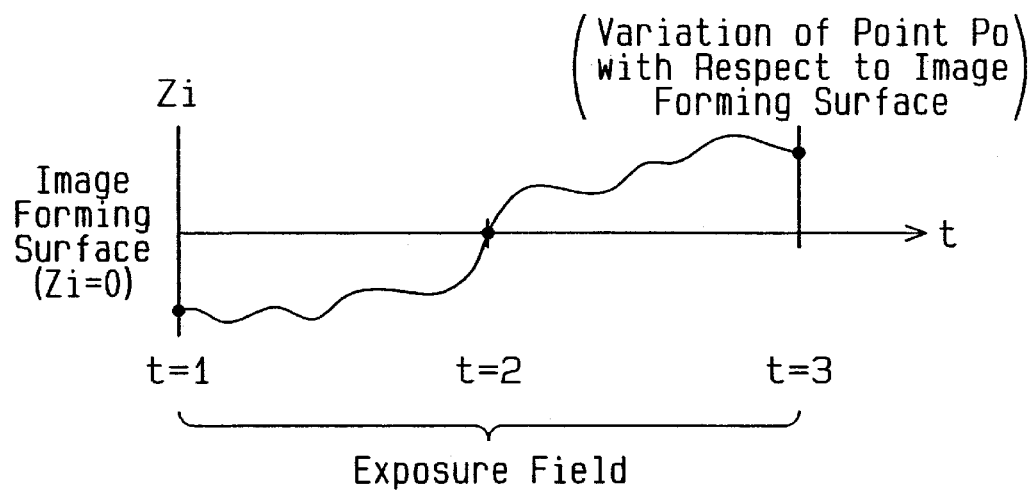
FIG. 10C is an explanatory diagram showing a variation of one point with respect to an image forming surface.
Figure 11:
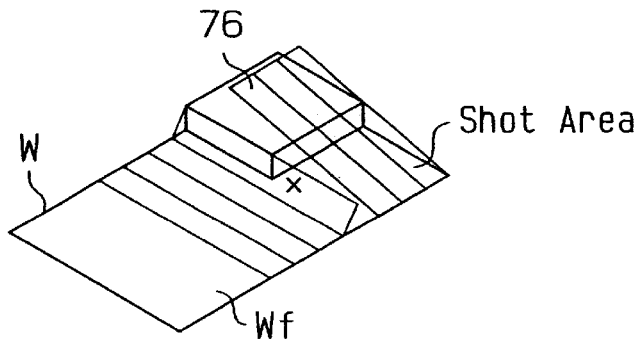
FIG. 11 is an explanatory diagram showing the relationship between a slit exposure field and an exposure surface at the time of exposure.

Specifically, the flatness data shows the surface shape (see FIG. 10A), such as a step of each measuring shot area, and the trace data shows in what pose the exposure field 76 has undergone exposure with respect to the flatness data (see FIG. 10B). Once the two data are known, the amount of deviation (or variation) Zi with respect to the image forming surface (see FIG. 10C) between the time when the exposure field 76 enters and the time when the exposure field 76 leaves, both at each point in the measuring shot area, e.g., point Po shown in FIG. 10B. While each position in each measuring shot area of the exposure surface Wf is pre-read, the exposure process is carried out by causing the exposure surface Wf to trace the target position. The Z average offset and the movement standard deviation are however needed as data that represents a pose error indicating in what pose and at what height the slit exposure field 76 passes each point in each measuring shot area during the exposure process (see FIG. 11). The Z average offset is the amount of a variation at each point averaged by the slit width of the exposure field 76, and the movement standard deviation is a fluctuation component of the variation at each point, which has been statistically processed with the slit width. Without the movement standard deviation, one cannot understand whether the amount of fluctuation of the variation varies significantly or the fluctuation has occurred generally without a large variation. To know how much each position in each measuring shot area varies with respect to the image forming surface of the projection optical system, therefore, both the Z average offset and movement standard deviation are needed. In the modification, the Z average offset and CD-focus data are needed.

(2) If the Z average offsets and movement standard deviations (or CD-focus data) alone are acquired during exposure of the individual measuring shot areas or after exposure of all of the shot areas is completed, the variation amount of the exposure line width of each measuring shot area can be predicted easily by collating the acquired data with prestored data of the Z average offset and movement standard deviation (or CD-focus data) and old data which is comprised of data of the exposure line width corresponding to those pieces of data.

(3) A target measuring shot area for which the variation amount ΔCD of the exposure line width is to be measured can be selected easily automatically or manually from a plurality of shot areas on a map which shows that shot area.

(4) The Z average offset and movement standard deviation (or CD-focus data) that are measured during exposure of each measuring shot area can be registered in a database, e.g., the memory 91 together with various conditions, such as the then exposure line width, defocus amount, illumination condition (e.g., annular illumination) and the scanning direction (Y-directional scanning or −Y-directional scanning) at the measurement. Those registered data can therefore be retrieved as needed.

(5) Based on the trace data and flatness data at the time of exposing each shot area, the CPU 90 as image-state prediction means can obtain such a prediction result that the exposure line width will vary over a given value during exposure. In the case where such a result is obtained, the ΔCD management apparatus 28 as control means sends the main control system 27 an instruction indicating that exposure is underway, thereby stopping the exposure process.

(6) The CPU can predict the variation amount of the exposure line width or the state of the pattern image at the time of exposure, during or after exposure, by collating the Z average offset and movement standard deviation obtained during exposure (or preacquired CD-focus data) with old data stored in the memory 91. When the variation amount of the exposure line width actually measured is greater than old data of the variation amount of the exposure line width stored in the memory 91, it is understood that this variation has originated from other causes than the focus error.

(7) Since the variation amount of the exposure line width is displayed on display means, it is possible to easily determine if the displayed variation amount of the exposure line width exceeds a predetermined allowable range. For example, the variation amount ΔCD of the exposure line width of each measuring shot area is three-dimensionally displayed as shown in FIG. 17. From the graph, one can see at a glance how much the exposure line width varies at each portion in each measuring shot area. It is therefore possible to easily see the variation amount of the exposure line width with respect to the designed line width.

(8) As shown in FIG. 18, a graph which shows the defocus amount on the horizontal scale and the movement standard deviation Zmsd on the vertical scale can be prepared. When the defocus amount and the movement standard deviation Zmsd vary with respect to a given designed line width, one can easily see the degree of variation of the measured value (measured line width) of the exposure line width of each portion in a measuring shot area actually exposed.

(9) As data for displaying various graphs as shown in FIGS. 9 and 12 to 18 is saved in the memory 91, data of the necessary graph can be retrieved and displayed on the display section 94. Seeing those graphs, therefore, one can easily manage a variation in the exposure line width of each measuring shot area for each wafer W.

(10) Because the ΔCD management apparatus 28 is provided as separate from the main control system 27 of the scanning exposure apparatus 21 and is constituted by a computer, a high-performance scanning exposure apparatus equipped with the ΔCD management apparatus 28 can easily be realized without hardly modifying the conventional scanning exposure apparatus.

(Second Embodiment)

Figure 22:
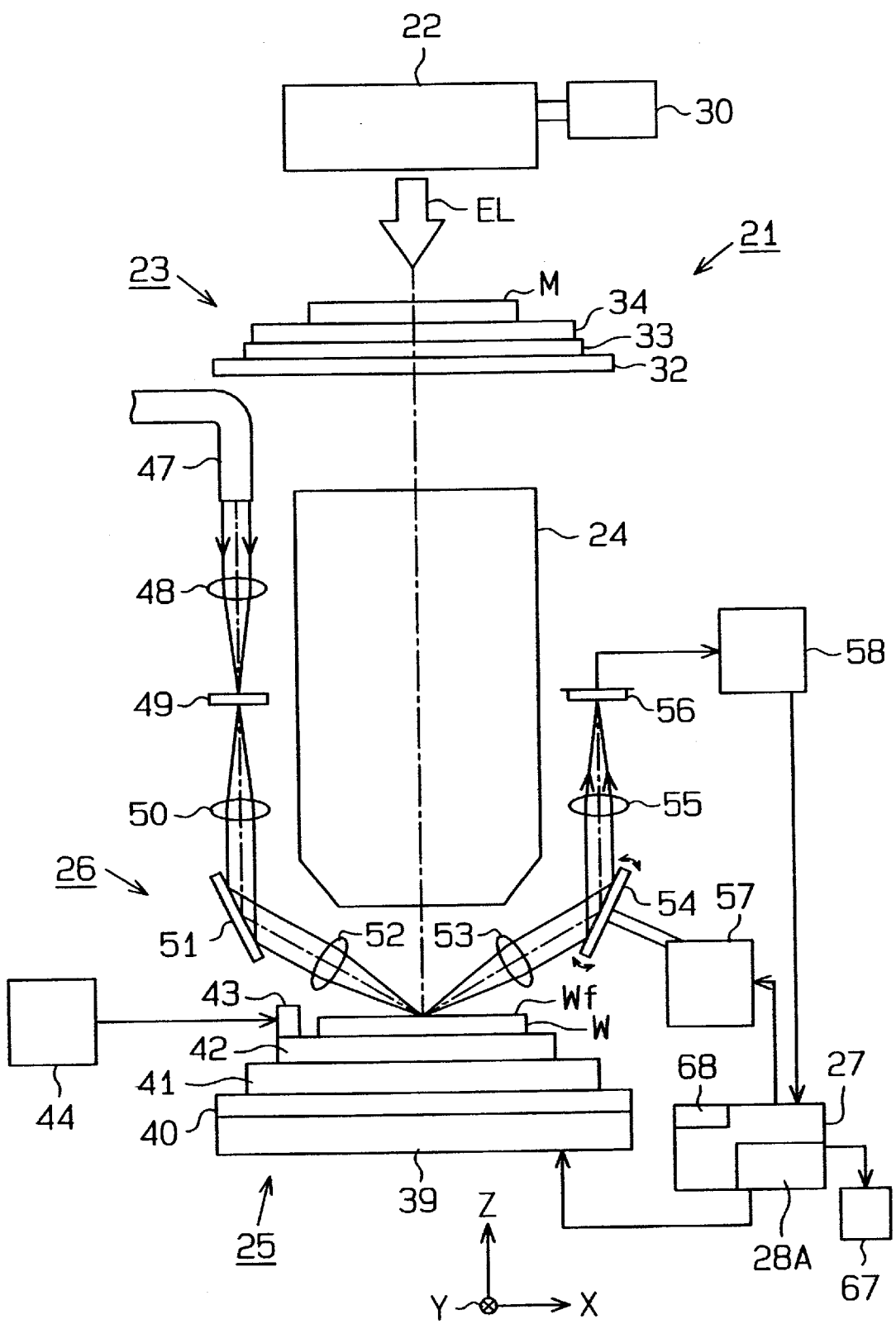
FIG. 22 is a structural diagram of a scanning exposure apparatus according to the second embodiment of the present invention.
Figure 23:
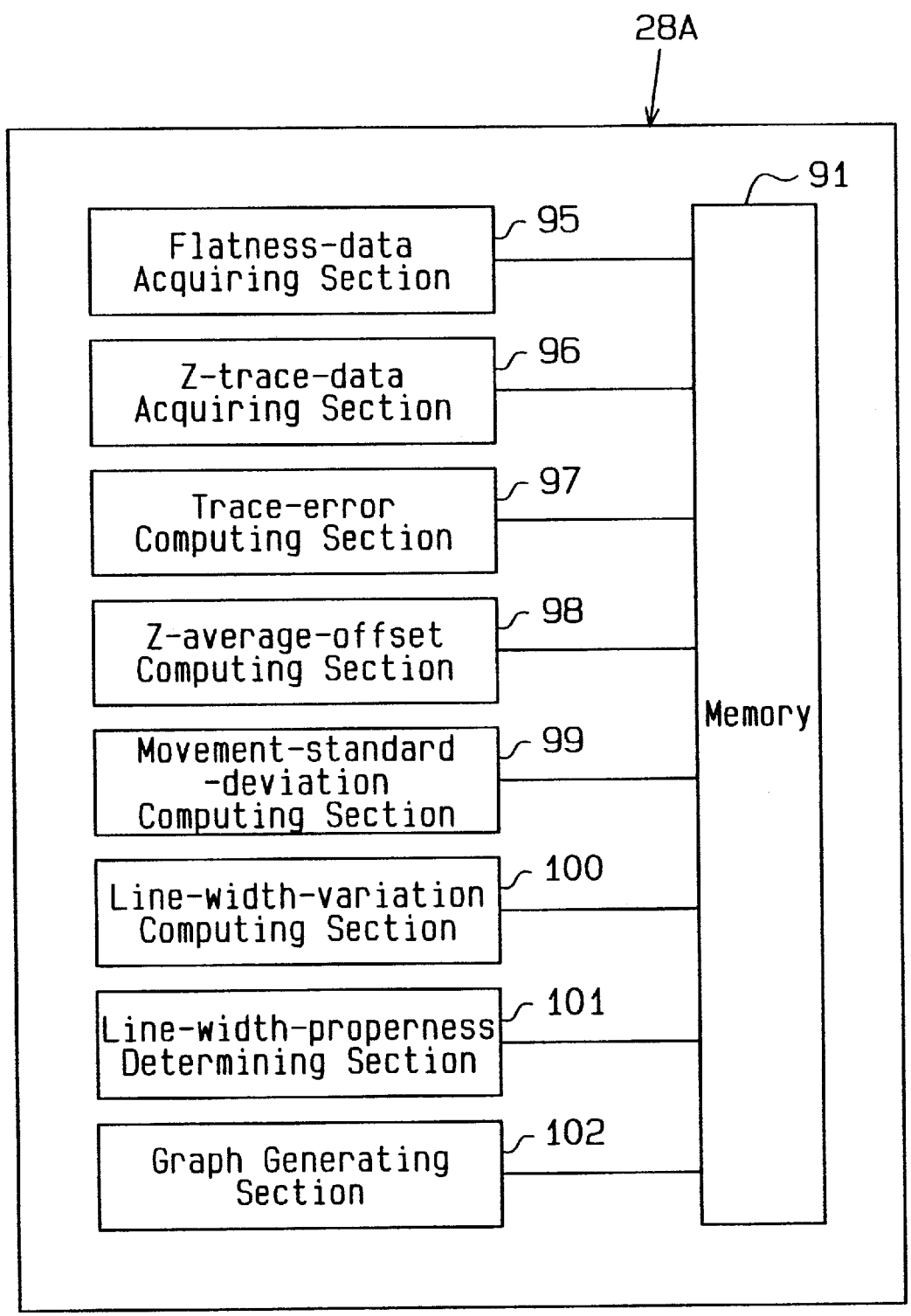
FIG. 23 is a block diagram showing a ΔCD management apparatus incorporated in the main control system of the scanning exposure apparatus shown in FIG. 19.

A second embodiment of the scanning exposure apparatus according to the present invention will now be described referring to FIGS. 22 and 23.

In the first embodiment, the ΔCD management apparatus 28 is provided as separate from the main control system 27 of the scanning exposure apparatus 21. In the second embodiment, a ΔCD management apparatus 28A having the equivalent capabilities of the ΔCD management apparatus 28 is incorporated in the main control system 27. The ΔCD management apparatus 28A differs from the ΔCD management apparatus 28 only in that it does not have the input section 93 and the display section 94. In the second embodiment, data such as the measured line width can be input through an unillustrated input device provided in the scanning exposure apparatus 21. Data of various graphs generated by the ΔCD management apparatus 28A is stored in a memory 68 as a data storage section in the main control system 27. Therefore, a display device 67 can display graph of the necessary data by retrieving.

The second embodiment with the above-described structure has the following advantage in addition to the advantages (1) to (10) of the first embodiment and modification.

(11) The main control system 27 controls the process of exposing other shot areas than those measuring shot areas hatched in FIG. 4, the process of exposing the individual measuring shot areas, and the ΔCD measuring process. Unlike the first embodiment, therefore, the second embodiment does not require a special computer which constitutes the ΔCD management apparatus 28 and can significantly cut the cost down accordingly.

(Third Embodiment)

A third embodiment of the scanning exposure apparatus according to the present invention will now be discussed.

In the third embodiment, the CPU 90 as image-state prediction means has an image-forming simulation capability (image-forming simulation means) added to the CPU of the first embodiment to calculate the exposure line width as the state of the image of a pattern or the variation amount of the exposure line width. The CPU 90 of the third embodiment does not therefore require storage of the data shown in FIG. 18. The third embodiment is the same as the first embodiment in other points, The image-forming simulation capability is to compute the exposure line width or the variation amount of the exposure line width based on data of the Z average offset and movement standard deviation in addition to various performances of the projection optical system 24, such as the designed line width of a pattern, the defocus amount (the amount of the Z-directional deviation of the exposure surface Wf) and the numerical aperture (NA) of the lens, various kinds of data, such as illumination condition (e.g., annular illumination) for illuminating the mask M and the scanning direction.

The third embodiment calculates the exposure line width or the variation amount of the exposure line width based on data of the Z average offset and movement standard deviation in addition to various data. Without a database where old data of the exposure line widths of patterns is registered, therefore, the exposure line width or the variation amount of the exposure line width can be predicted during or after exposure if various data is merely input to the CPU 90.

Figure 24:
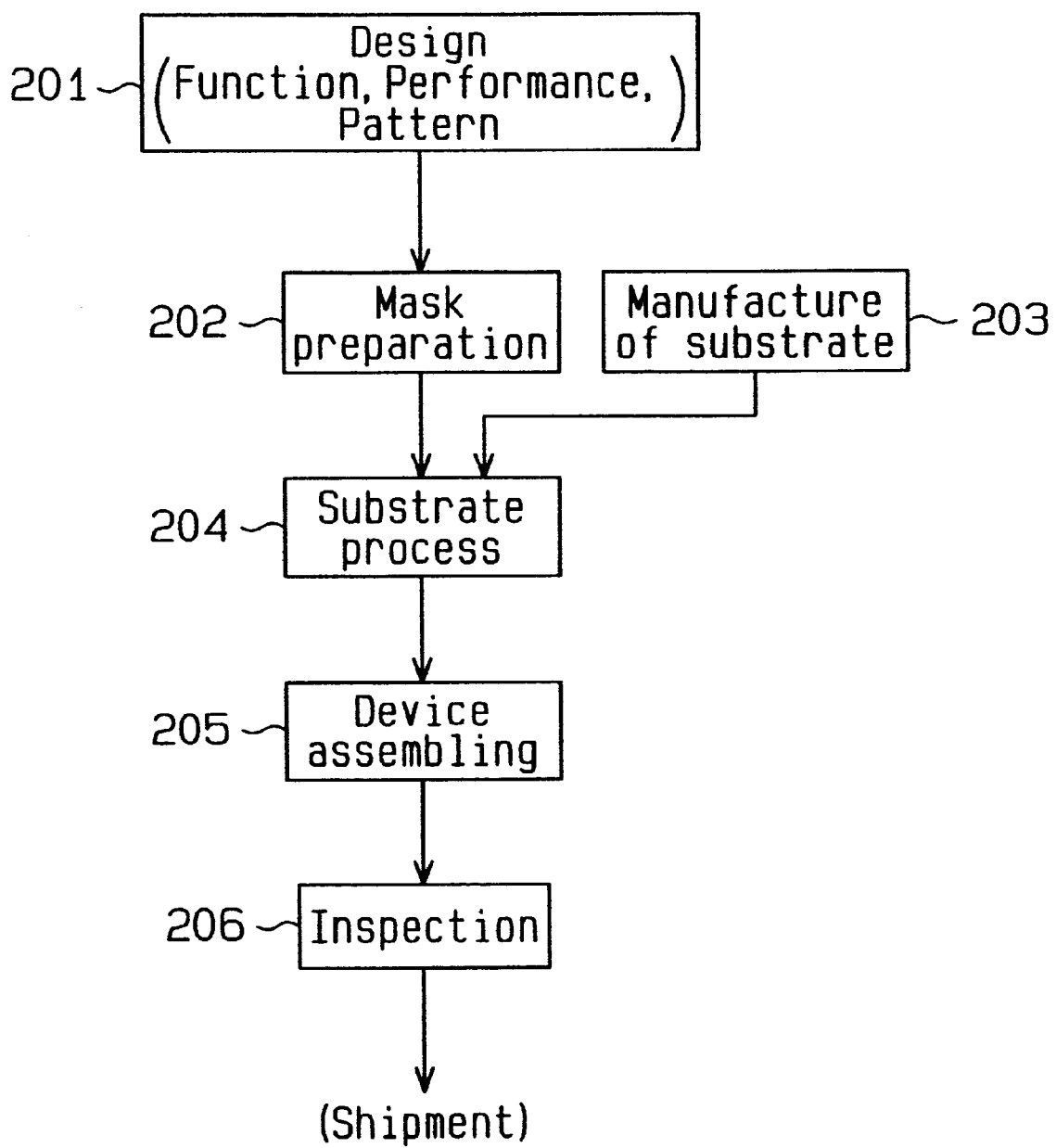
FIG. 24 is a flowchart exemplifying a device manufacturing process.

As shown in FIG. 24, a device (a semiconductor chip, such as IC or LSI, a liquid crystal panel, a CCD, a thin-film magnetic head or a micro machine) is manufactured through a step of designing the functions and performances of the device (e.g., designing the circuit of a semiconductor device) (step 201), a step of producing a reticle (mask) on which a circuit pattern based on the design step is formed (step 202), a step of producing a substrate (wafer, glass plate or the like) or the base of the device (step 203), a substrate processing step of forming an actual circuit or the like on the substrate by the lithography technology or the like using the produced or manufactured reticle (mask) and the substrate (stop 204), a device assembling step of assembling the device using the processed substrate (including a dicing step, bonding step and packaging step; step 205) and an inspection step of performing inspection, such as an operation test for the manufactured device and a durability test (step 206).

In the case of a semiconductor device, for example, the wafer processing step includes an oxidization step of oxidizing the surface of the wafer, a CVD step of forming an insulating film on the wafer surface, an electrode forming step of forming electrodes on the wafer by vapor deposition and an ion implanting step of implanting ions in the wafer as pre-processing at the individual stages of the wafer process, and is selected and executed in accordance with processes needed at the individual stages. Post-processing that is executed after the pre-processing is completed includes a resist forming step of coating a photosensitive material on the wafer, an exposure step of transferring the circuit pattern on the mask on the wafer using the exposure apparatus and exposure method of each of the above-described embodiments, a development step of developing the exposed wafer, an etching step of etching off other exposed members than that portion where the resist remains, and a resist removing step of removing the resist that has become unnecessary after etching. As those pre-processing and post-processing are repeated, multiple circuit patterns are formed on the wafer.

According to the device manufacturing method discussed above, a pattern on a reticle is transferred on a wafer by the exposure apparatus and exposure method of each of the above-described embodiments in the exposure step that constitutes the lithography step together with the resist forming step and development step. When the exposure line width of the pattern varies, therefore, it is possible to determine first how much influence the focus state at the time of exposure error has exerted as a cause of varying the exposure line width.

The present invention can also be adapted to an exposure apparatus which is used in manufacturing a micro device, such as a semiconductor device, a thin-film magnetic head and an image pickup device (CCD or the like). The invention can further be adapted to an exposure apparatus which transfers a circuit pattern on a glass substrate or silicon wafer in order to produce reticles or masks that are used in an optical exposure apparatus, EUV exposure apparatus, X-ray exposure apparatus, electron beam exposure apparatus and so forth. The exposure apparatuses that use DUV (Deep UltraViolet) rays or VUV (Vacuum UltraViolet) rays generally use a transparent type reticle and uses quartz glass, fluorine-doped quartz glass, fluorite, magnesium fluoride or crystal as a reticle substrate. The X-ray exposure apparatus of the proximity type or the electron beam exposure apparatus uses a transparent mask (stencil mask or membrane mask) and a silicon wafer as a mask substrate.

The exemplified projection optical system and illumination optical system of each embodiment are to be considered as illustrative and not restrictive. For instance, the projection optical system is not limited to a refraction optical system, but a reflection system comprising only a reflection optical element or a reflection refraction system (cata-deoptric system) which has a reflection optical element and a refraction optical element may be used as well. The exposure apparatus that uses vacuum ultraviolet (VUV) rays having a wavelength of about 200 nm or lower may use a reflection refraction system as the projection optical system. A reflection refraction system which has a beam splitter and a concave mirror as reflection optical elements, as disclosed in, for example, U.S. Pat. Nos. 5,668,672 and 5,835,275, or a reflection refraction system which does not use a beam splitter but uses a concave mirror or the like as a reflection optical element, as disclosed in, for example, U.S. Pat. No. 5,689,377 and U.S. patent application Ser. No. 873,605 (filed on Jun. 12, 1997) can be used as the projection optical system of the reflection refraction type. The disclosures of the U.S. patents and the U.S. patent application are incorporated herein by reference.

The projection optical system may also use a reflection refraction system, as disclosed in U.S. Pat. Nos. 5,031,976, 5,488,229 and 5,717,518, which has a plurality of refraction optical elements and two mirrors (a main mirror or a concave mirror and a sub mirror or a back mirror which has a reflection surface formed on the opposite side to the incident surface of a refraction element or a parallel plane plate) arranged on the same axis and forms an intermediate image of a reticle pattern, formed by the refraction optical elements, again on a wafer by the main mirror and sub mirror. In this reflection refraction system, the main mirror and sub mirror are arranged following the refraction optical elements, and the illumination light passes a part of the main mirror, is reflected at the sub mirror and the main mirror in the name order, and reaches the top of the wafer after passing a part of the sub mirror. The disclosures of those U.S. patents are incorporated herein by reference.

The projection optical system 24 can use any of a reduction system, an equal magnification system and an enlarging system.

In the first embodiment, when the wafer W is scanned in the Y direction in FIG. 2, the first to third rows of photosensors are used to pre-read an area located ahead of the exposure field 76 on the exposure surface Wf by 4 mm in the scanning direction. The pre-read area is not limited to an area located ahead of the exposure field 76 by 4 mm as long as it is located immediately in front of the exposure field 76. Likewise, when the wafer W is scanned in the −Y direction in FIG. 2, the fifth to third rows of photosensors are used to pre-read an area located ahead of the exposure field 76 on the exposure surface Wf by 4 mm in the scanning direction. Likewise, the pre-read area is not limited to an area located ahead of the exposure field 76 by 4 mm as long as it is located immediately in front of the exposure field 76.

Although an area located ahead of the exposure field 76 on the exposure surface Wf in the scanning direction is pre-read and a target value is computed based on the pre-reading result in the first embodiment, the position of an area on the exposure surface located immediately ahead of the exposure field 76 may be measured so that a target value is computed based on the measured position, and the Z-leveling stage 42 may be controlled and moved to the target position right after the computation before exposure takes place.

The present examples, the embodiments and the modification are to be considered as illustrative and not restrictive and the invention is not to be limited to the details given herein, but may be modified within the scope and equivalence of the appended claims.

What is claimed is:

1. A scanning exposure apparatus for projecting an image of a pattern of a mask on a substrate using exposure light and scanning the substrate with the exposure light to expose an exposure area on the substrate, comprising:
    surface position detection means for detecting surface position information of the substrate;
    adjustment means for adjusting a surface position of the substrate based on a result of detection by the surface position detection means; and
    control means for acquiring pose information of the substrate adjusted by the adjustment means at a time of exposure based on a detection signal from the surface position detection means and storing the pose information in a memory in association with preacquired surface shape information of the exposure area on the substrate.

2. The scanning exposure apparatus according to claim 1, wherein the control means includes image-state prediction means for predicting a state of the image of the pattern transferred on the substrate based on the pose information and the surface shape information.

3. The scanning exposure apparatus according to claim 2, wherein the pose information includes a trace error of the substrate with respect to a control target position of the substrate which is adjusted by the adjustment means.

4. The scanning exposure apparatus according to claim 3, wherein the control means computes at least one of an average deviation amount of an optical-axial directional position of the substrate with respect to a target position at a plurality of measuring points on an exposure surface of the substrate during irradiation of the exposure light and a standard deviation of a fluctuation component of the optical-axial directional position during irradiation of the exposure light, based on the trace error and the surface shape information.

5. The scanning exposure apparatus according to claim 4, wherein the control means further includes a data storage section for prestoriny at least one of the average deviation amount and the standard deviation of the fluctuation component and data of the state of the image of the pattern transferred on the substrate in association with each other, and the image-state prediction means predicts the state of the image of the pattern exposed, based on the state data of the image of the pattern stored in the data storage section and at least one of the average deviation amount and the standard deviation of the fluctuation component which have been acquired during exposure or after exposure.

6. The scanning exposure apparatus according to claim 1, wherein the state of the image of the pattern includes line width information of the pattern formed on the substrate.

7. The scanning exposure apparatus according to claim 2, wherein the image-state prediction means includes image-forming simulation means for computing the state of the image of the pattern based on data including a performance of a projection optical system, an illumination condition for illuminating the mask and a designed line width of the pattern.

8. The scanning exposure apparatus according to claim 2, further comprising decision means for deciding that exposure is abnormal when the state of the image of the pattern predicted by the image-state prediction means goes off a predetermined allowable range.

9. The scanning exposure apparatus according to claim 2, further comprising display means for displaying the state of the image of the pattern predicted by the image-state prediction means by at least one of numerical data, a two-dimensional expression and a three-dimensional expression.

10. A scanning exposure method of projecting an image of a mask pattern on a substrate using exposure light and relatively scanning the substrate with the exposure light to expose an exposure area on the substrate, comprising the steps of:
    detecting a surface position of the substrate at a time of exposure and detecting pose information of the substrate; and
    predicting a state of the image of the pattern formed on the substrate based on the detected pose information and preacquired surface shape information in an exposure area of the substrate.

11. The scanning exposure method according to claim 10, wherein data of the state of the image of the pattern transferred on the substrate is prestored in association with pose error information acquired from the pose information and the surface shape information, and the state of the image of the pattern formed on the substrate is predicted based on the stored data.

12. The scanning exposure method according to claim 11, wherein the pose error information includes at least one of an average deviation amount of an optical-axial directional position of the substrate with respect to a target position at a plurality of measuring points on an exposure surface of the substrate during irradiation of the exposure light and a standard deviation of a fluctuation component of the optical-axial directional position during irradiation of the exposure light.

13. The scanning exposure method according to claim 10, wherein the state of the image of the pattern includes line width information of the pattern formed on the substrate.

14. The scanning exposure method according to claim 10, further comprising the step of deciding that exposure is abnormal when the predicted state of the image of the pattern goes off a predetermined allowable range.

15. A management apparatus for managing exposure process information of a scanning exposure apparatus which includes surface position detection means for detecting surface position information of a substrate and adjustment means for adjusting a surface position of the substrate based on a result of detection by the surface position detection means, the scanning exposure apparatus projecting an image of a pattern of a mask on the substrate using exposure light and scanning the substrate with the exposure light to expose an exposure area on the substrate, the management apparatus comprising:
    an interface connected to the scanning exposure apparatus; and
    control means for acquiring pose information of the substrate adjusted by the adjustment means at a time of exposure based on a detection signal from the surface position detection means acquired via the interface, and storing the pose information in a memory in association with preacquired surface shape information of the exposure area on the substrate.

16. The management apparatus according to claim 15, wherein the control means includes image-state prediction means for predicting a state of the image of the pattern transferred on the substrate based on the pose information and the surface shape information.

17. The management apparatus according to claim 16, wherein data of the state of the image of the pattern transferred on the substrate is prestored in association with pose error information acquired from the pose information and the surface shape information, and the image-state prediction means predicts the state of the image of the pattern formed on the substrate based on the stored data.

18. The management apparatus according to claim 17, wherein the pose error information includes at least one of an average deviation amount of an optical-axial directional position of the substrate with respect to a target position at a plurality of measuring points on an exposure surface of the substrate during irradiation of the exposure light and a standard deviation of a fluctuation component of the optical-axial directional position during irradiation of the exposure light.

19. The management apparatus according to claim 16, wherein the state of the image of the pattern includes line width information of the pattern formed on the substrate.

20. The management apparatus according to claim 16, further comprising decision means for deciding that exposure is abnormal when the predicted state of the image of the pattern goes off a predetermined allowable range.

21. A management method of managing exposure process information of a scanning exposure apparatus which includes surface position detection means for detecting surface position information of a substrate and adjustment means for adjusting a surface position of the substrate based on a result of detection by the surface position detection means, the scanning exposure apparatus projecting an image of a pattern of a mask on the substrate using exposure light and scans the substrate with the exposure light to expose an exposure area on the substrate, the management method comprising the steps of:
  acquiring a detection signal of the surface position detection means via an interface from the scanning exposure apparatus;
  acquiring pose information of the substrate adjusted by the adjustment means at a time of exposure; and
  predicting a state of the image of the pattern formed on the substrate based on the pose information and preacquired surface shape information of the exposure area on the substrate.

22. The management method according to claim 21, wherein data on the state of the image of the pattern transferred on the substrate is prestored in association with pose error information acquired from the pose information and the surface shape information, and the state of the image of the pattern formed on the substrate is predicted based on the stored data.

23. The management method according to claim 22, wherein the pose error information includes at least one of an average deviation amount of an optical-axial directional position of the substrate with respect to a target position at a plurality of measuring points on an exposure surface of the substrate during irradiation of the exposure light and a standard deviation of a fluctuation component of the optical-axial directional position during irradiation of the exposure light.

24. The management method according to claim 21, wherein the state of the image of the pattern includes line width information of the pattern formed on the substrate.

25. The management method according to claim 21, further comprising the step of deciding that exposure is abnormal when the predicted state of the image of the pattern goes off a predetermined allowable range.

26. A device manufacturing method comprising the step of:
  executing a lithography process using a scanning exposure method of projecting an image of a mask pattern on a substrate using exposure light and relatively scanning the substrate with the exposure light to expose an exposure area on the substrate, the scanning exposure method including the steps of:
    detecting pose information of the substrate by detecting a surface position of the substrate at a time of exposure; and
    predicting a state of the image of the pattern formed on the substrate based on the detected pose information and preacquired surface shape information in an exposure area of the substrate.

27. A device manufacturing method comprising the step of:
  executing a lithography process using a management method of managing exposure process information of a scanning exposure apparatus which includes surface position detection means for detecting surface position information of a substrate and adjustment means for adjusting a surface position of the substrate based on a result of detection by the surface position detection means, the scanning exposure apparatus projecting an image of a pattern of a mask on the substrate using exposure light and scanning the substrate with the exposure light to expose an exposure area on the substrate, the management method including the steps of:
    acquiring a detection signal of the surface position detection means via an interface from the scanning exposure apparatus;
    acquiring pose information of the substrate adjusted by the adjustment means at a time of exposure; and
    predicting a state of the image of the pattern formed on the substrate based on the pose information and preacquired surface shape information of the exposure area on the substrate.

* * * * *